(12) United States Patent
Urano

(10) Patent No.: US 8,492,256 B2
(45) Date of Patent: Jul. 23, 2013

(54) METHOD OF MANUFACTURING SEMICONDUCTOR APPARATUS

(75) Inventor: Yuichi Urano, Matsumoto (JP)

(73) Assignee: Fuji Electric Co., Ltd. (JP)

(*) Notice: Subject to any disclaimer, the term of this patent is extended or adjusted under 35 U.S.C. 154(b) by 60 days.

(21) Appl. No.: 13/084,603

(22) Filed: Apr. 12, 2011

(65) Prior Publication Data

US 2011/0256668 A1  Oct. 20, 2011

(30) Foreign Application Priority Data

Apr. 14, 2010 (JP) ................. 2010-093260

(51) Int. Cl.
  *H01L 21/20* (2006.01)
(52) U.S. Cl.
  USPC ............... 438/584; 438/309; 438/652
(58) Field of Classification Search
  USPC .......... 438/234, 268, 309, 584, 652, 928
  See application file for complete search history.

(56) References Cited

U.S. PATENT DOCUMENTS

| | | | | |
|---|---|---|---|---|
| 4,830,984 A * | 5/1989 | Purdes | ............ | 438/492 |
| 6,703,707 B1 | 3/2004 | Mamitsu et al. | | |
| 7,727,785 B2 * | 6/2010 | Connell et al. | .......... | 438/24 |
| 8,183,144 B2 * | 5/2012 | Matsumura et al. | .......... | 438/614 |
| 2003/0022464 A1 | 1/2003 | Hirano et al. | | |
| 2004/0241946 A1 * | 12/2004 | Kim et al. | .......... | 438/279 |
| 2005/0170555 A1 | 8/2005 | Hirano et al. | | |
| 2006/0234472 A1 | 10/2006 | Gabriel et al. | | |
| 2007/0004098 A1 | 1/2007 | Kazama et al. | | |
| 2010/0013008 A1 * | 1/2010 | Oikawa | .......... | 257/329 |

FOREIGN PATENT DOCUMENTS

| | | |
|---|---|---|
| JP | 2002-110893 A | 4/2002 |
| JP | 2003-110064 A | 4/2003 |
| JP | 2004-241443 A | 8/2004 |
| JP | 3607143 B2 | 1/2005 |
| JP | 2005-353960 A | 12/2005 |
| JP | 2006-156567 A | 6/2006 |
| JP | 2006-520088 A | 8/2006 |
| JP | 3823974 B2 | 9/2006 |
| JP | 3829860 B2 | 10/2006 |
| JP | 2007-036211 A | 2/2007 |
| JP | 4049035 B2 | 2/2008 |
| JP | 2009-054965 A | 3/2009 |
| JP | 4333650 B2 | 9/2009 |
| JP | 4344560 B2 | 10/2009 |

OTHER PUBLICATIONS

Tadao Hayashi et al. "Basis and Application of Electroless Plating" published May 30, 1994 by Business & Technology Daily News, Nikkan Kogyo Shimbun Ltd., Translation of relevant portion provided.

* cited by examiner

*Primary Examiner* — Fernando L Toledo
*Assistant Examiner* — Bryan Junge
(74) *Attorney, Agent, or Firm* — Rossi, Kimms & McDowell LLP

(57) ABSTRACT

A method of manufacturing a semiconductor apparatus includes forming back surface electrode 4 on back surface of semiconductor wafer 20, that bends convexly toward the front surface side due to back surface electrode 4 being formed; treating the back surface with a plasma for removing the deposits on the back surface; sticking removable adhesive tape 23 to the back surface along the warp thereof for maintaining the bending state of semiconductor wafer 20 after the step of sticking; electrolessly plating to form film 26 on the front surface of semiconductor wafer 20; peeling off removable adhesive tape 23; cutting out semiconductor chips; and mounting the semiconductor chip by bonding with a solder for manufacturing a semiconductor apparatus. The manufacturing method prevents external appearance anomalies from occurring on the back surface electrode, improves the reliability, and allows manufacture of the semiconductor apparatuses with a high throughput of non-defective products.

36 Claims, 12 Drawing Sheets

METHOD OF MANUFACTURING SEMICONDUCTOR APPARATUS

BACKGROUND OF THE INVENTION

A. Field of the Invention

The present invention relates to a method of manufacturing a semiconductor apparatus.

B. Description of the Related Art

An insulated gate bipolar transistor (hereinafter referred to as an "IGBT"), that is one of the power semiconductor devices, exhibits high-speed switching performances and voltage-driven characteristics, which the metal-oxide-semiconductor field-effect transistor (hereinafter referred to as a "MOSFET") exhibits, and low ON-state voltage characteristics, which the bipolar transistor exhibits. The IGBT's expand the application fields thereof from general-purpose inverters, AC servos, uninterruptible power sources (UPS's), and switching power supplies to boost DC-DC converters for hybrid vehicles.

For manufacturing the semiconductor devices described above, a method described below is proposed in Japanese Unexamined Patent Application Publication No. 2007-036211. A surface structure is formed on the first major surface side of a silicon (Si) substrate. After polishing the second major surface for thinning the Si substrate, a buffer layer and a collector layer are formed on the second major surface side. Then, an aluminum silicon film (AlSi film) is formed on the collector layer. The AlSi film is 0.3 µm or more and 1.0 µm or less in thickness. The Si concentration in the AlSi film is 0.5 wt % or higher and 2 wt % or lower. Preferably, the Si concentration in the AlSi film is 1 wt % or less.

Subsequently to forming the AlSi film, a titanium film (Ti film), a nickel film (Ni film), a gold film (Au film) and such metal films are formed by vacuum deposition or by sputtering to form a collector electrode. The Ti film is a buffer metal film, the Ni film a solder bonding metal film, and Au film a protector metal film, respectively.

In mounting the semiconductor device having electrodes on the front and back surfaces, the collector electrode and such a back surface electrode are bonded to a metal plate working as a heat sink with a solder. The emitter electrode and such a front surface electrode are bonded mainly by the wire bonding technique using an aluminum wire. In these days however, the front surface electrodes are bonded by solder bonding sometimes. By employing the solder bonding technique for bonding the front surface electrodes, the mounting density, the current density, the wiring capacitance reduction for realizing a higher switching speed, and the cooling efficiency of the semiconductor apparatus are improved greatly.

The semiconductor apparatus proposed in Japanese Unexamined Patent Application Publication No. 2002-110893 and described below mounts a semiconductor device thereon by solder bonding. A metal plate functioning as a heat sink is bonded with a solder to the surface of each semiconductor chip, in which a semiconductor device is formed, a second conductor is bonded with a solder to the back surface of the semiconductor chip, and a third conductor is bonded with a solder to the front surface of the heat sink. A step is formed on the heat sink to form a thin portion such that the bonding area between the heat sink and the third conductor is smaller than the bonding area between the heat sink and each semiconductor chip. In the state in which the back surface of the second conductor and the front surface of the third conductor are exposed, the semiconductor chips, the heat sink, the second conductor and the third conductor are sealed with a resin.

The semiconductor apparatus disclosed in Japanese Unexamined Patent Application Publication No. 2003-110064 includes a semiconductor device, a first metal body working as an electrode and as a radiator and bonded to the back surface of the semiconductor device, a second metal body working as an electrode and as a radiator and bonded on the front surface side of the semiconductor device, and a third metal body bonded between the semiconductor device surface and the second metal body. Almost the entire semiconductor apparatus is molded with a resin. The semiconductor device is made to be thin to reduce the shearing stress in the semiconductor device surface or to reduce the stress components in the bonding layers, through which the semiconductor device and the metal bodies are bonded, and the entire apparatus is restrained by the mold resin. The bonding layers are made from a solder containing tin as the main component thereof (hereinafter referred to as a "Sn solder").

The semiconductor apparatus proposed in the following Japanese Patent Publication No. 3823974 includes a semiconductor device between a pair of metal plates. Almost the entire semiconductor apparatus is molded with a resin. The semiconductor apparatus proposed in Japanese Patent Publication No. 3823974 facilitates preventing the malfunction of the semiconductor device caused by the movement of the metal plate in the final stage of bonding thereof to the semiconductor chip from occurring and the life thereof from being shortened.

In bonding the surface electrodes of the semiconductor device with a solder in practice, it is necessary to plate Ni and such a metal onto the surface electrodes. For the plating, the electrolytic plating method or the electroless plating method may be employed generally. The electrolytic plating method feeds an external current to reduce the metal ions in a solution and to precipitate the metal atoms. The electroless plating method reduces the metal ions in a solution chemically without using electricity to precipitate metal atoms (cf. the Denki Mekki Kenkyuukai (The Society for the Study of Electrolytic Plating), "Mudenkai Mekki Kiso to Ohyo (Electroless Plating Fundamentals and Applications)" (in Japanese), published in May, 1994 by Business & Technology Daily News (Nikkan Kogyo Shimbun Ltd.), pp. 1 to 238). The metal deposition by the electroless plating method facilitates simplifying the manufacturing installation and the manufacturing process as compared with the electrolytic plating method that needs an electric circuit including counter electrodes and a DC power supply.

Japanese Patent Publication No. 4344560 proposes a semiconductor chip as described below. The semiconductor chip proposed in Japanese Patent Publication No. 4344560 includes a semiconductor device including front surface electrodes, to the surfaces of which electroless plating is applied. The semiconductor device includes also a back surface electrode bonded to the circuit pattern patterned on an insulator baseboard. The surface electrodes are bonded to connecting conductors. On an Al layer forming the surface electrode, a Ni layer and an Au layer laminated on the Ni layer are formed by electroless plating employing the zincate method such that the thermal conductivity of the electrode film is made to be uniform. The connecting conductor formed on the electrode film to constitute a heat dissipation path, and the electrode film, are bonded to each other via a lead-free solder layer.

FIG. 24 is a flow chart describing a conventional manufacturing method for manufacturing a semiconductor chip. First, the front surface structure of an IGBT including a base region and an emitter region is formed in the surface portion on the front surface side of a semiconductor wafer (step S101). An emitter electrode in contact with the base region and the emitter region is formed as a front surface electrode (step S102). A protector film made from polyimide is formed on the front surface of the semiconductor wafer and an opening is formed through the protector film such that the emitter electrode is exposed (step S103). The protector film covers the semiconductor wafer surface exposed to the front surface side. Back grinding and etching are conducted from the back surface side of the semiconductor wafer to thin the semiconductor wafer (step S104). Back surface semiconductor regions including a collector region are formed in the surface portion on the back surface side of the semiconductor wafer (step S105). A back surface electrode, in contact with the collector region and formed by laminating multiple metal electrode layers, is formed on the back surface of the semiconductor wafer (step S106). A supporting baseboard is stuck to the back surface of the semiconductor wafer (step S107). An electroless Ni—P/Au plate film formed of an electroless Ni-phosphorus (P) plate layer and an electroless Au plate layer is formed on the front surface of the semiconductor wafer by electroless plating (step S108). The semiconductor wafer is diced into semiconductor chips. The semiconductor chip, the surfaces of the front surface electrodes thereon are treated by electroless plating, is completed.

Japanese Unexamined Patent Application Publication No. 2005-353960 proposes a manufacturing method for manufacturing the semiconductor chip as described above. In applying an electroless plating treatment to the surface of the electrode terminal formed on the first surface side of a silicon wafer, the manufacturing method proposed in Japanese Unexamined Patent Application Publication No. 2005-353960 sticks a dicing tape to the entire second surface of the silicon wafer as an electrical insulating material. After insulating the entire second surface of the silicon wafer, the manufacturing method proposed in Japanese Unexamined Patent Application Publication No. 2005-353960 applies the electroless plating treatment to the surface of the electrode terminal.

Japanese Patent Publication No. 3829860 proposes a method for forming a front surface electrode on a semiconductor wafer in the state, in which the semiconductor wafer is fixed onto a supporting baseboard. A semiconductor chip is obtained by dicing the semiconductor wafer. The semiconductor chip includes electrodes on the major front and back surfaces thereof. Metal bodies, each functioning as an electrode and for a radiator, are arranged on the major front and back surface sides of the semiconductor chip. The semiconductor chip is mounted on a semiconductor apparatus, almost the entire of which is molded with a resin.

Japanese Patent Publication No. 4049035 proposes a method for forming a plate film on the front surface side of a semiconductor wafer to form a front surface electrode, for thinning the semiconductor wafer from the back surface side opposite to the front surface, and for forming a back surface electrode including a Ni film on the back surface of the thinned semiconductor wafer. The manufacturing method proposed in Japanese Patent Publication No. 4049035 thins the semiconductor wafer first and, then, forms the back surface electrode. After forming the back surface electrode, the manufacturing method proposed in Japanese Patent Publication No. 4049035 forms the plate film to form only the front surface electrode.

Japanese Unexamined Patent Application Publication No. 2009-054965 proposes a method as described below. A covering adhesive tape is stuck onto the back surface of a wafer, on which a back surface electrode film is formed. Then, the wafer, on which the covering adhesive tape is adhering, is dipped into an electroless Ni plating solution in a plating bath to form a Ni plate film on a wiring film formed on the wafer major surface. Then, an Au plate film is formed on the Ni plate film in the similar manner as the Ni plate film to form an under barrier metal plate film (UBM plate film) formed of the Ni and Au plate films. When the wafer major surface is bent such that the wafer major surface is shaped to be concave, the wafer, on which the covering adhesive tape is adhering, is treated thermally.

Japanese Patent Publication No. 4333650 discloses a method for applying a plating treatment to a semiconductor wafer supported by a dicing tape having a frame and for dicing the semiconductor wafer.

Japanese Patent Publication No. 3607143 proposes a method for sticking a protector tape to a semiconductor wafer. A semiconductor wafer, the position thereof is determined, is fed onto a mounting table, absorbed to the mounting table and fixed on the mounting table. A protector tape is cut by a protector tape cutter such that the size and the shape thereof coincide with the size and the shape of the semiconductor wafer. The non-adhesive surface of the cut protector tape is absorbed and held by an absorber table, moveable up and down, capable of shaking and moveable from the tape cutter to the mounting table. The absorber table in the tilting state thereof is moved above the mounting table such that the protector tape is right above the semiconductor wafer. The absorber table is made to descend such that the down side portion of the tilting protector tape is laid on the semiconductor wafer. The absorber table is made to shake in the vacuum atmosphere horizontally around the down side portion of the tilting absorber table for pressing to stick the entire adhesive surface of the protector tape onto the semiconductor wafer.

Japanese Unexamined Patent Application Publication (Translation of PCT Application) No. 2006-520088 proposes a preliminary treatment method for treating an adhering surface in the case, in which another constituent element is stuck to a semiconductor chip. After one or more adhering surfaces are treated preliminary, adhesion is conducted to connect two or more baseboards to the semiconductor chip. A plasma is made to react to the one or more adhering surfaces under the atmospheric pressure as the preliminary treatment.

Japanese Unexamined Patent Application Publication No. 2006-156567 proposes a method as described below. A surface protector tape stuck to a semiconductor wafer includes a base material layer and an adhesive material layer. The base material layer has a slit on the surface thereof opposite to the surface in contact with the adhesive material layer. The base material layer may be treated physically or chemically to improve the adhesiveness thereof to the adhesive material layer coated afterward on the base material layer. The chemical treatment includes a plasma treatment.

Japanese Unexamined Patent Application Publication No. 2004-241443 proposes a method of cleaning the front and back surfaces of a semiconductor wafer in a plasma cleaning machine to remove organic deposits on a semiconductor wafer. The cleaned semiconductor wafer is stuck to a dicing sheet via a film adhesive to divide the semiconductor wafer into semiconductor devices together with the film adhesive thereon by dicing.

As the results of the researches explored vigorously by the present inventors, it has been found that the problems as described below will be caused, if a semiconductor chip is manufactured by any of the techniques disclosed by Japanese Patent Publication No. 3829860 and Japanese Unexamined Patent Application Publication No. 2009-054965.

FIGS. 19 through 22 are cross sectional views of a semiconductor wafer describing a conventional method of manufacturing a semiconductor chip. FIGS. 19 through 22 describe the steps subsequent to step S106 described in FIG. 24. In FIGS. 19 through 22, the front surface structure is not shown. In FIGS. 19 through 22, neither the emitter electrode nor the back surface electrode on the semiconductor wafer is shown.

As described in FIG. 19, semiconductor wafer 120 is bending convexly toward the front surface side due to the tensile stress caused by a back surface electrode after the formation thereof (cf. step S106 in FIG. 24). Semiconductor wafer 120 is bent convexly toward the front surface side, since the laminate film formed of metal layers and working as a back surface electrode generates a tensile stress greater than the tensile stress that the emitter electrode formed as a front surface electrode (cf. step S102 in FIG. 24) generates. If a thermal treatment is conducted, e.g., at 350° C., to reduce the contact resistance of the back surface electrode, a greater tensile stress will be caused on the back surface side of semiconductor wafer 120. When semiconductor wafer 120 is thinned to be from 80 to 140 µm in thickness (cf. step S104 in FIG. 24), the warp tW of semiconductor wafer 120 will be, for example, from 1 to 8 mm (cf. FIG. 6 in Japanese Patent Publication No. 4049035).

The techniques disclosed in Japanese Patent Publication No. 3829860 and Japanese Unexamined Patent Application Publication No. 2009-054965 rid semiconductor wafer 120 of the warp tW as described above. Supporting baseboard 121 stuck to the back surface of semiconductor wafer 120 as shown in FIG. 20 rids semiconductor wafer 120 of the warp tW (cf. step S107 in FIG. 24 and Japanese Patent Publication No. 3829860), since the stress large enough to keep semiconductor wafer 120 flat is exerted to semiconductor wafer 120 from supporting baseboard 121.

Even if plate film 122 is formed on the front surface of semiconductor wafer 120 as described in FIG. 21 (cf. step S108 in FIG. 24) and a tensile stress is caused by plate film 122 on the front surface side of semiconductor wafer 120, semiconductor wafer 120 will keep the flat state thereof, since semiconductor wafer 120 is supported by supporting baseboard 121.

Even if the semiconductor wafer happens to bend concavely toward the front surface side due to the plate film formed on the front surface of the semiconductor wafer, the warp caused in the semiconductor wafer will be gotten rid of by heating the tape stuck to the back surface of the semiconductor wafer to exert tension to the tape by the technique disclosed in Japanese Unexamined Patent Application Publication No. 2009-054965. This situation is not illustrated.

The techniques disclosed in Japanese Patent Publication No. 3829860 and Japanese Unexamined Patent Application Publication No. 2009-054965 rid the semiconductor wafer of the warp thereof. However, it has been revealed that the semiconductor wafer will bend again, when the supporting baseboard or the tape stuck to the back surface of the semiconductor wafer is removed. For example, if the supporting baseboard stuck to the back surface of semiconductor wafer 120 is removed as shown in FIG. 22, semiconductor wafer 120 will bend concavely toward the front surface side in opposite to the state before the supporting baseboard is stuck (cf. FIG. 19). The reason for this may be estimated as described below.

Semiconductor wafer 120 is forced to be in the flat state by the stress exerted from supporting baseboard 121. The flat state is maintained on the back surface side of semiconductor wafer 120, after supporting baseboard 121 is removed. On the front surface side of semiconductor wafer 120, a tensile stress is caused by plate film 122 formed on the front surface of semiconductor wafer 120. Therefore, semiconductor wafer 120 is bent concavely toward the front surface side from the flat state contrary to the descriptions of the techniques described in the Japanese Patent Publication No. 3829860. Therefore, it is estimated that the semiconductor wafer bends again as a further stress is exerted thereto in the state, in which the semiconductor wafer is maintained to be flat, or as the stress for maintaining the semiconductor wafer in the flat state thereof is removed.

FIG. 23 is a cross sectional view of a semiconductor chip, in which a warp is caused. In FIG. 23, the front surface structure is not shown. In FIG. 23, neither the emitter electrode nor the back surface electrode on the semiconductor wafer is shown.

Semiconductor chip 101 in FIG. 23 is manufactured by dicing (cutting) the semiconductor wafer bending concavely toward the front surface side (cf. FIG. 22) into chips. It has been found that semiconductor chip 101 will bend concavely toward the front surface side, when semiconductor chip 101 is obtained by dicing the semiconductor wafer bending concavely toward the front surface side. In other words, a warp tC is caused in semiconductor chip 101 in the same direction as the warp caused in the semiconductor wafer bending concavely toward the front surface side.

When semiconductor chip 101 is bending as long as 30 µm, the problems as described below will be caused. In measuring the electric characteristics of semiconductor chip 101 in the shipping inspections or in screening the defective chips, semiconductor chip 101 will not be absorbed to a carrier hand nor to a measuring stage or semiconductor chip will 101 not be absorbed at the right position on the measuring stage. Then, the electric characteristics of the semiconductor device formed in semiconductor chip 101 will not be measured accurately.

In bonding a metal plate to semiconductor chip 101 with a solder, the solder layer thickness between semiconductor chip 101 and the metal plate is designed to be from 70 to 130 µm. If semiconductor chip 101 is bending as long as 30 µm, voids will be caused in the solder layer by the warp tC of semiconductor chip 101, when semiconductor chip 101 is mounted by bonding with a solder. Due to the voids caused, semiconductor chip 101 will be displaced from the right position or it will be impossible to mount semiconductor chip 101. Therefore, the throughput of non-defective semiconductor apparatus products will be impaired. Due to the voids caused, the reliability of the semiconductor apparatus will be lowered.

Or else, the entire solder layer or a part of the solder layer is thinned due to the warp tC of semiconductor chip 101, resulting in the short life of the semiconductor apparatus or the lower reliability of the semiconductor apparatus. Further, semiconductor chip 101 or the metal plate may be displaced from the right bonding position or a short-circuit fault may be caused due to the warp tC of semiconductor chip 101, resulting in the low throughput of non-defective semiconductor apparatus products.

As for the technique disclosed in Japanese Unexamined Patent Application Publication No. 2009-054965, when the adhesiveness between the back surface electrode and the tape is low, the tape may peel off the semiconductor wafer and the plating solution may come in between the semiconductor wafer and the tape. If the back surface electrode is exposed to the plating solution, the plating material will segregate abnormally on the back surface electrode, the edge portion surface of the surface electrode will be tarnished (hereinafter referred to as "external appearance anomalies"), and such a new problem will be caused. If external appearance anomalies are caused on the back surface electrode, the wettability of the back surface electrode to the solder will be impaired. If the wettability of the back surface electrode to the solder is not good, wettability will be caused in the boundary between the back surface electrode and the solder layer in mounting the semiconductor device by bonding with a solder. The voids caused will lower the reliability of the semiconductor apparatus.

In view of the foregoing, it is a first object of the invention to obviate the problems described above. It is a second object of the invention to provide a method of manufacturing a semiconductor apparatus that facilitates improving the reliability of the semiconductor apparatus. It is a third object of the invention to provide a method of manufacturing a semiconductor apparatus that facilitates improving the throughput of the non-defective semiconductor apparatus products. It is a fourth object of the invention to provide a method of manufacturing a semiconductor apparatus that facilitates preventing the external appearance anomalies of the surface electrodes from occurring.

The present invention is directed to overcoming or at least reducing the effects of one or more of the problems set forth above.

SUMMARY OF THE INVENTION

According to the subject matter of the appended Claim 1, there is provided a method of manufacturing a semiconductor apparatus, the method including the steps of:
  forming a back surface electrode on the back surface of a semiconductor wafer;
  sticking a film or a tape to the back surface of the semiconductor wafer in the bending state due to the back surface electrode formed thereon for maintaining the bending state of the semiconductor wafer; and
  plating a plate film on the front surface of the semiconductor wafer in the bending state thereof, the plate film functioning as a front surface electrode, the step of plating being conducted after the step of sticking.

According to the subject matter of the appended Claim 2, there is provided a method of manufacturing a semiconductor apparatus, the method including the steps of:
  forming a back surface electrode on the back surface of a semiconductor wafer;
  sticking a film or a tape to the back surface of the semiconductor wafer for bringing the semiconductor wafer into a bending state, in which the semiconductor wafer is bending convexly toward the front surface side of the semiconductor wafer, the step of sticking being conducted after the step of forming; and
  plating a plate film on the front surface of the semiconductor wafer in the bending state thereof, the plate film functioning as a front surface electrode.

According to the subject matter of the appended Claim 3, there is provided a method of manufacturing a semiconductor apparatus, the method including the steps of:
  sticking a film or a tape to the back surface of a semiconductor wafer in a bending state, in which the semiconductor wafer is bending convexly toward the front surface side of the semiconductor wafer due to a back surface electrode formed on the back surface of the semiconductor wafer, for maintaining the bending state of the semiconductor wafer; and
  plating a plate film on the front surface of the semiconductor wafer in the bending state thereof, the plate film functioning as a front surface electrode, the step of plating being conducted after the step of sticking.

According to the subject matter of the appended Claim 4, the method further includes the step of:
  cutting the semiconductor wafer into a plurality of a semiconductor chip, the step of cutting being conducted after the step of plating.

According to the subject matter of the appended Claim 5, the method further includes the step of:
  peeling the tape or the film off the semiconductor wafer, the step of peeling being conducted after the step of plating and before the step of cutting.

According to the subject matter of the appended Claim 6, the method further includes the steps of:
  bonding a metal body to the front surface side and the back surface side of the semiconductor chip cut out through the step of cutting, the metal body functioning as a radiator, the metal bodies being connected electrically to the front surface electrode and the back surface electrode, respectively; and
  sealing at least the semiconductor chip entirely.

According to the subject matter of the appended Claim 7, the front surface of the semiconductor wafer is absorbed to a stage in the step of sticking for flattening the semiconductor wafer, and the film or the tape is stuck to the back surface of the flattened semiconductor wafer.

According to the subject matter of the appended Claim 8, the film or the tape is adhering such that the film or the tape covers at least the back surface electrode on the semiconductor wafer.

According to the subject matter of the appended Claim 9, the film or the tape is adhering such that the film or the tape covers the back surface of the semiconductor wafer entirely.

According to the subject matter of the appended Claim 10, the film or the tape is adhering such that the film or the tape is extending outward from the back surface edge of the semiconductor wafer.

According to the subject matter of the appended Claim 11, the film or the tape is extending outward from the back surface edge of the semiconductor wafer for 1 mm or less.

According to the subject matter of the appended Claim 12, the film or the tape is stuck in the step of sticking in the state, in which the film or the tape is pulled outward such that a tensile force is exerted to the film or the tape.

According to the subject matter of the appended Claim 13, the film or the tape is heated at 40° C. or higher and 60° C. or lower in the step of sticking.

According to the subject matter of the appended Claim 14, the rigidity of the film or the tape is lower than the rigidity of the semiconductor wafer.

According to the subject matter of the appended Claim 15, the film or the tape is 40 µm or more and 80 µm or less in thickness.

According to the subject matter of the appended Claim 16, the film or the tape contains one of the polymers selected from the group consisting of (polyimide, polyphenylene sulfide, polyethylene terephthalate, and aromatic polyamide) as one of the main components.

According to the subject matter of the appended Claim 17, the film or the tape, the adhesive strength thereof is lowered by heat or an ultraviolet ray, is used in the step of sticking.

According to the subject matter of the appended Claim 18, the film or the tape includes an adhesive layer adhering such that the adhesive layer is in contact with the back surface of the semiconductor wafer, and the adhesive layer is hardened by heat or an ultraviolet ray such that the adhesive strength thereof is lowered.

According to the subject matter of the appended Claim 19, the film or the tape includes an adhesive layer adhering such that the adhesive layer is in contact with the back surface of the semiconductor wafer, and the adhesive layer contains a polymer made mainly from an acrylate as a main component.

According to the subject matter of the appended Claim 20, the film or the tape includes an adhesive layer adhering such that the adhesive layer is in contact with the back surface of the semiconductor wafer, and the adhesive layer generates vapor therefrom by heat or an ultraviolet ray such that the adhesive strength thereof is lowered.

According to the subject matter of the appended Claim 21, the back surface electrode includes a laminate film including a gold electrode layer laminated as the outermost layer of the laminate film.

According to the subject matter of the appended Claim 22, the plate film is formed by the electroless plating method.

According to the subject matter of the appended Claim 23, the plate film includes a laminate film including a first plate layer made from nickel and a second plate layer on the first plate layer, the second plate layer being made from gold.

According to the subject matter of the appended Claim 24, the first plate layer is plated in an electroless plating bath kept at 75° C. or higher and 85° C. or lower.

According to the subject matter of the appended Claim 25, the second plate layer is plated in an electroless plating bath kept at 70° C. or higher and 80° C. or lower.

According to the subject matter of the appended Claim 26, the first plate layer contains an alloy made from nickel and phosphorus and the phosphorus concentration in the first plate layer is 2 wt % or higher and 8 wt % or lower.

According to the subject matter of the appended Claim 27, the plate film is 3 μm or more and 6 μm or less in thickness.

According to the subject matter of the appended Claim 28, the method further includes the step of forming an electrode containing aluminum as a main component on the front surface of the semiconductor wafer before forming the back surface electrode on the back surface of the semiconductor wafer, and the plate film is formed in the step of plating on the electrode containing aluminum as the main component thereof.

According to the subject matter of the appended Claim 29, the method further includes the step of thinning the semiconductor wafer from the back surface side before forming the back surface electrode on the back surface of the semiconductor wafer, and the back surface electrode is formed on the back surface of the thinned semiconductor wafer.

According to the subject matter of the appended Claim 30, the semiconductor wafer is thinned in the step of thinning to be 80 μm or more and 140 μm or less in thickness.

According to the subject matter of the appended Claim 31, the method further including the step of plasma treatment treating the back surface of the semiconductor wafer with a plasma for removing the deposits sticking to the back surface of the semiconductor wafer, the step of plasma treatment being conducted after the step of forming the back surface electrode and before the step of sticking.

According to the subject matter of the appended Claim 32, the front surface and the back surface of the semiconductor wafer are treated with a plasma simultaneously in the step of plasma treatment for removing the deposits sticking to the front surface and the back surface of the semiconductor wafer simultaneously.

According to the subject matter of the appended Claim 33, oxygen is used as a raw material in the step of plasma treatment.

According to the subject matter of the appended Claim 34, a capacitively coupled plasma generation mechanism is used in the step of plasma treatment.

According to the subject matter of the appended Claim 35, a batch-type plasma treatment apparatus that treats a plurality of the semiconductor wafers collectively is used in the step of plasma treatment.

According to the subject matter of the appended Claim 36, a plasma treatment apparatus that treats the front surface and the back surface of the semiconductor wafer simultaneously is used in the step of plasma treatment.

According to the invention, a tape is stuck to the back surface of a semiconductor wafer in the step of sticking such that the bending state of the semiconductor wafer, in which the semiconductor wafer is bending convexly toward the front surface side, is maintained. Since the step of plating is conducted in the bending state, in which the semiconductor wafer is bending convexly toward the front surface side, the tensile stresses on the front and back surface sides of the semiconductor wafer balance to each other. Therefore, the semiconductor wafer is brought into an almost flat state, after the tape is removed. Therefore, the warp of the semiconductor chip cut out from the semiconductor wafer is reduced. Since the warp of the semiconductor chip is reduced, it is possible to absorb the semiconductor chip exactly at the right position on a stage in measuring the electric characteristics of the semiconductor chip and to measure the electric characteristics of the semiconductor chip securely.

Since the warp of the semiconductor chip is reduced, the voids due to the warp of the semiconductor chip are prevented from occurring in the solder layer in the step of mounting the semiconductor chip. Therefore, the mounting position deviation of the semiconductor chip and the short-circuit fault caused by the voids in the solder layer are prevented from occurring. The life of the semiconductor apparatus is prevented from becoming shorter.

Since the warp of the semiconductor chip is reduced, the entire or a part of the solder layer is prevented from becoming thinner than the predetermined thickness in mounting the semiconductor chip. Therefore, the mounting position deviation of the semiconductor chip and the short-circuit fault caused by the nonuniform solder layer thickness are prevented from occurring. The life of the semiconductor apparatus is prevented from becoming shorter.

In the step of sticking, the entire back surface electrode is covered with a film or a tape (hereinafter referred to simply as a "tape," and in the claims as a "first film"). By conducting the step of plasma treatment before the step of sticking, the adhesive strength between the back surface electrode and the tape is improved. Therefore, the back surface electrode is protected securely with the tape. As the back surface electrode is protected securely with the tape, the plating solution never comes in between the back surface electrode and the tape in the step of plating. Since the back surface electrode surface is not exposed to the plating solution, the wettability of the back surface electrode to a solder is prevented from being impaired. Therefore, voids are prevented from occurring in the boundary between the back surface electrode and the solder layer in bonding the semiconductor chip manufactured by cutting the semiconductor wafer into chips with a solder.

By the manufacturing method according to the invention, the reliability of the semiconductor apparatus is improved. By the manufacturing method according to the invention, the semiconductor apparatuses are manufactured with a high throughput of non-defective products. By the manufacturing method according to the invention, external appearance anomalies are prevented from occurring on the back surface electrode.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
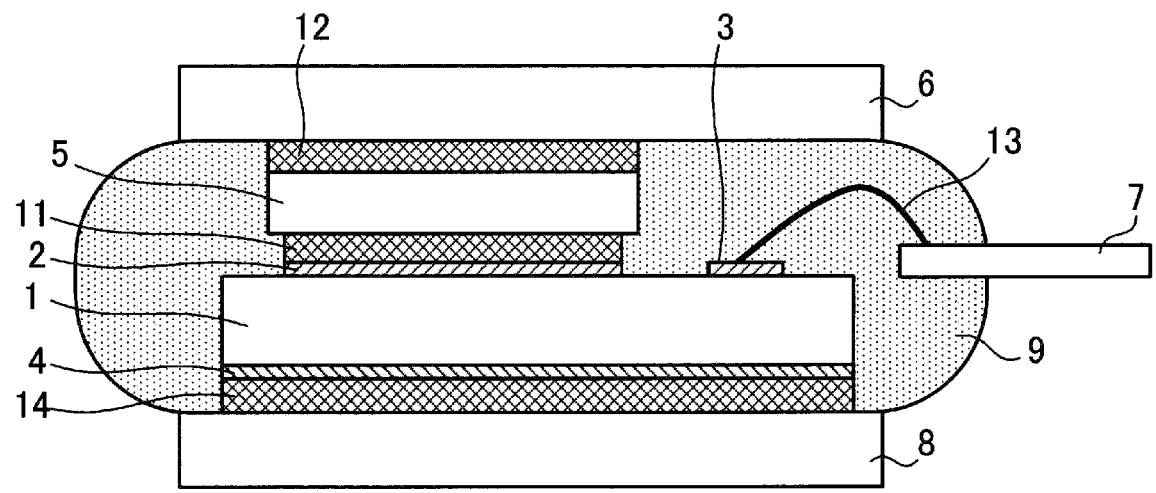
FIG. 1 is a cross sectional view of a semiconductor apparatus according to a first embodiment of the invention.

Now the invention will be described in detail below with reference to the accompanied drawings which illustrate the preferred embodiments of the invention. In the following descriptions and the drawings which illustrate the preferred embodiments, the same reference numerals are used to designate the same constituent elements and their duplicated descriptions are not made for the sake of simplicity.

First Embodiment

FIG. 1 is a cross sectional view of a semiconductor apparatus according to a first embodiment of the invention. In FIG. 1, the front surface structure is not shown.

Referring now to FIG. 1, first front surface electrode 2 functioning as an emitter electrode and second front surface electrode 3 functioning as a gate electrode are formed on the front surface of semiconductor chip 1. A semiconductor device such as an IGBT (not shown) is formed in semiconductor chip 1. First front surface electrode 2 is formed of an emitter electrode and a plate film covering the emitter electrode. Back surface electrode 4 is formed on the back surface of semiconductor chip 1. Back surface electrode 4 is a collector electrode, for example.

First front surface electrode 2 is bonded to metal plate 5 via solder layer 11. Metal plate 6 is bonded via solder layer 12 to metal plate 5 surface opposite to metal plate 5 surface, to which first front surface electrode 2 is bonded. Second front surface electrode 3 is electrically connected via bonding wire 13 to metal plate 7 for connecting semiconductor chip 1 to, for example, an external apparatus (not shown). Back surface electrode 4 is connected to metal plate 8 via solder layer 14. The constituent elements between metal plates 6 and 8 are sealed with resin 9. Due to the sealing with resin 9, at least the entire of semiconductor chip 1 is enveloped with resin 9.

Metal plates 5, 6, and 8 function as radiators which dissipate the heat generated in semiconductor chip 1. Preferably, metal plates 5, 6, and 8 are made from a material that exhibits an excellent thermal conductivity. Preferably, metal plates 5, 6, and 8 may be a Cu plate, onto which an electroless Ni—P plate layer and an electroless Au plate layer are deposited and laminated in the order of the above description. By applying the plating treatments as described above to the surfaces of metal plates 5, 6, and 8, the affinities of the Cu plate surfaces for the soldering and the bonding are improved. Therefore, stable solder bonding is facilitated. Solder layers 11, 12, and 14 may be made from a lead-free (Pb-free) solder such as a tin (Sn)-silver (Ag)-copper (Cu) solder and a Sn—Ni—Cu solder with no problem. Bonding wire 13 may be a wire made from Al or Au with no problem.

Figure 2:
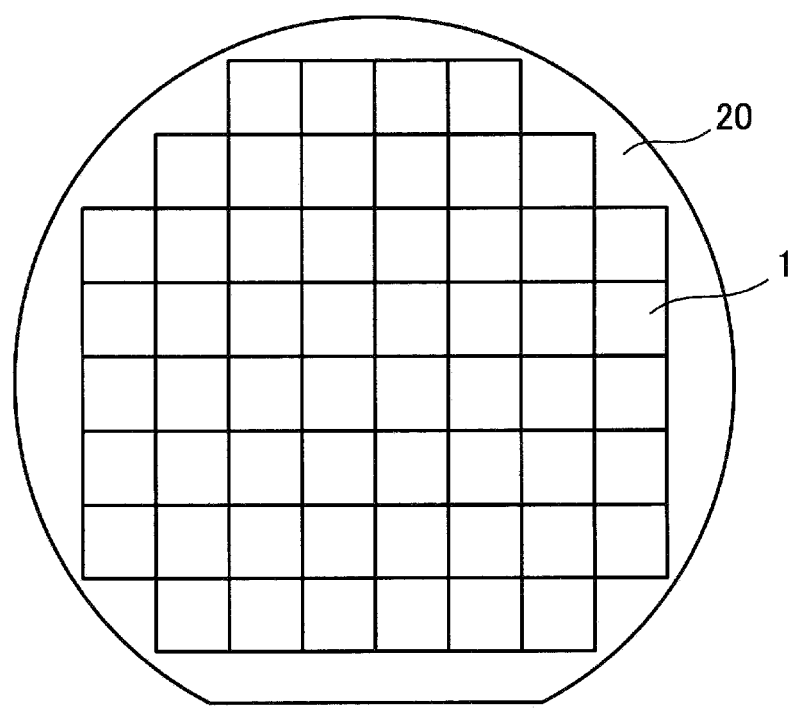
FIG. 2 is a top plan view of a semiconductor wafer according to the first embodiment of the invention.

FIG. 2 is a top plan view of a semiconductor wafer according to the first embodiment of the invention.

As shown in FIG. 2, semiconductor wafer 20 includes regions which will be semiconductor chips 1 after dicing. In the region which will be semiconductor chip 1 after dicing, a semiconductor device such as an IGBT (not shown) is formed. In semiconductor wafer 20, the regions, which will be semiconductor chips 1 after dicing, are formed, for example, in a lattice pattern. A dicing line is formed between adjacent semiconductor devices in semiconductor wafer 20.

Figure 3:
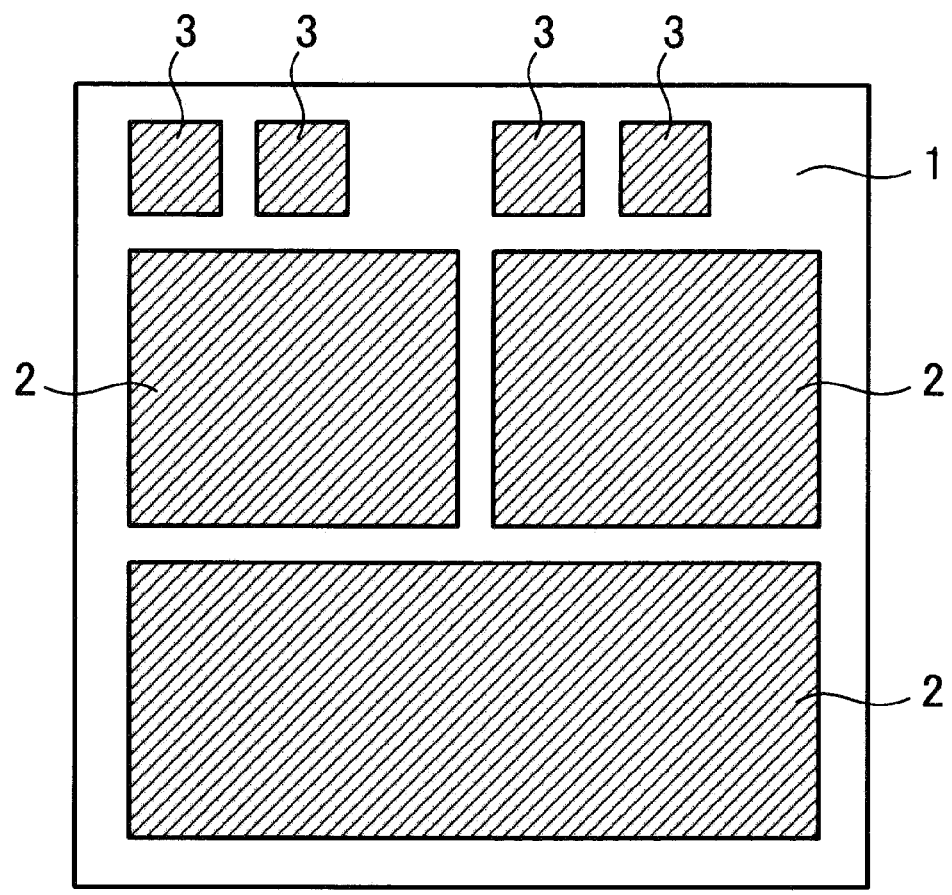
FIG. 3 is a top plan view of a semiconductor chip according to the first embodiment showing the front surface electrodes.

FIG. 3 is a top plan view of a semiconductor chip according to the first embodiment showing the front surface electrodes.

As shown in FIG. 3, a plurality of first front surface electrodes 2 and a plurality of second front surface electrodes 3 are formed on the front surface of semiconductor chip 1. First front surface electrodes 2 and second front surface electrodes 3 may be shaped with respective rectangular planar shapes. First front surface electrode 2 may be wider than second front surface electrode 3. Second front surface electrodes 3 may be arranged in parallel to each other in the edge area of semiconductor chip 1. The arrangement of the front surface electrodes in FIG. 3 is exemplary. The arrangement of the front surface electrodes may be changed variously in accordance with the semiconductor device formed in semiconductor chip 1.

Figure 4:
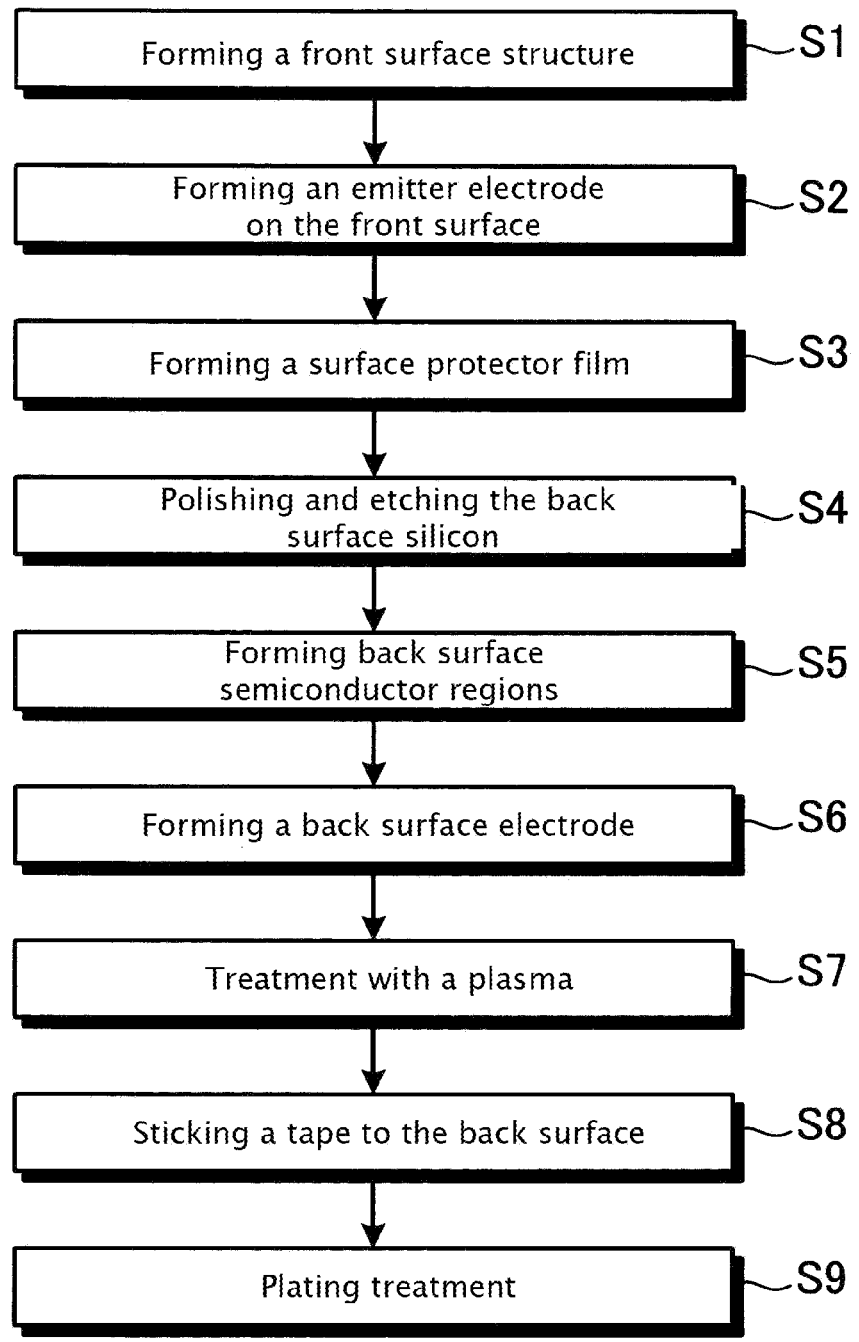
FIG. 4 is a flow chart describing a method of manufacturing a semiconductor chip according to the first embodiment of the invention.

FIG. 4 is a flow chart describing a method of manufacturing a semiconductor chip according to the first embodiment of the invention. FIGS. 5 through 10 are cross sectional views describing the method of manufacturing the semiconductor chip according to the first embodiment of the invention. In FIGS. 5 through 10, the front surface structure is not shown.

Referring at first to FIG. 4, a front surface structure including a base region and an emitter region (not shown) is formed in the surface portion on the front surface side of semiconductor wafer 20 by ion implantation and by thermal diffusion (step S1). The radius and the thickness of semiconductor wafer 20 are 150 mm and 600 µm, respectively.

Figure 5:
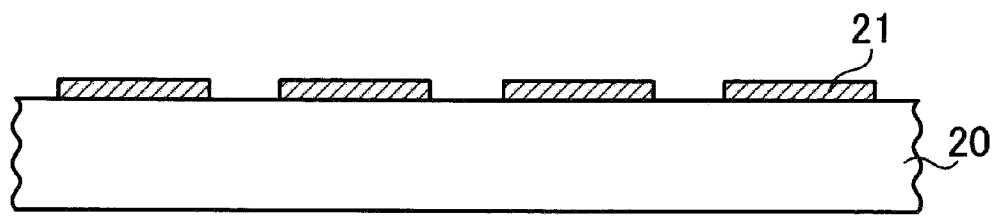
FIG. 5 is a first cross sectional view describing the method of manufacturing the semiconductor chip according to the first embodiment of the invention.

Emitter electrode 21 containing Al as the main component thereof is formed as a front surface electrode (step S2, FIG. 5). Emitter electrode 21 is formed such that emitter electrode 21 is in contact with the base region and the emitter region. Emitter electrode 21 constitutes a first front surface electrode, for example (cf. FIGS. 1 and 3). In other words, emitter electrode 21 is the lowermost layer of the first front surface electrode.

Figure 6:
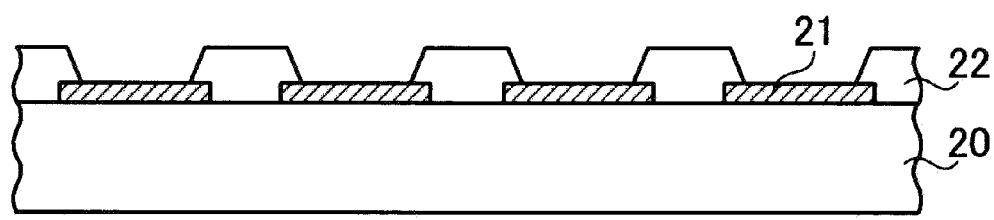
FIG. 6 is a second cross sectional view describing the method of manufacturing the semiconductor chip according to the first embodiment of the invention.

Then, polyimide protector film 22 is formed on the front surface of semiconductor wafer 20 and an opening is formed through polyimide protector film 22 such that emitter electrode is exposed (step S3, FIG. 6). Protector film 22 covers the semiconductor wafer 20 surface exposed to the front surface side.

Figure 7:
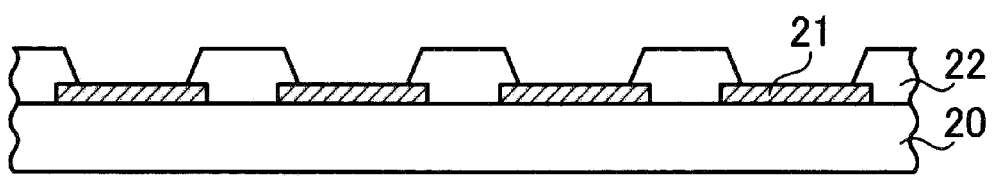
FIG. 7 is a third cross sectional view describing the method of manufacturing the semiconductor chip according to the first embodiment of the invention.
Figure 8:
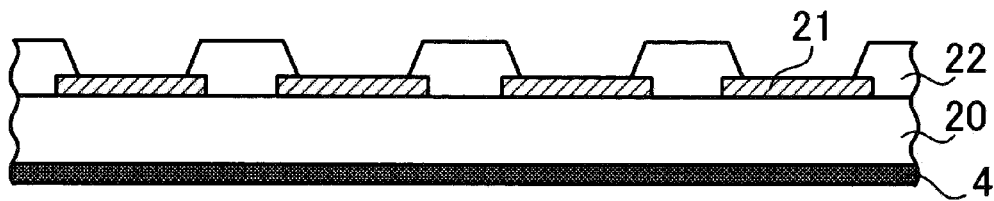
FIG. 8 is a fourth cross sectional view describing the method of manufacturing the semiconductor chip according to the first embodiment of the invention.

Then, back grinding and etching are conducted from the back surface side of semiconductor wafer 20 to thin semiconductor wafer 20 (step S4, FIG. 7: the step of thinning). After the thinning, semiconductor wafer 20 is 60 µm or more and 250 µm or less in thickness preferably. More preferably, semiconductor wafer 20 is 80 µm or more and 140 µm or less in thickness after the thinning. If semiconductor wafer 20 is 80 µm or more and 140 µm or less in thickness, it is expected that the resistance across the drift region of the IGBT is reduced, the tradeoff relation between the saturation voltage Vce (sat) and the turnoff loss Eoff is improved, and the resistance of the semiconductor device against heat is improved through the improvement of the heat dissipation performance of the semiconductor device.

Then, a back surface semiconductor region such as a collector region (not shown) is formed in the surface portion on the back surface side of semiconductor wafer 20 by ion implantation and by thermal diffusion (step S5). Then, back surface electrode 4, formed by laminating multiple metal electrode layers, is formed on the back surface of semiconductor wafer 20 (step S6, FIG. 8: the step of forming a back surface electrode). Back surface electrode 4 is formed such that back surface electrode 4 is in contact with the collector region. Then, a thermal treatment is conducted at 350° C. to form an ohmic contact in the boundary between back surface electrode 4 and the silicon substrate formed of semiconductor wafer 20 to reduce the contact resistance of back surface electrode 4.

In step S6, back surface electrode 4 may be formed as a laminate film formed of multiple electrode layers laminated, for example, by sputtering. For example, back surface electrode 4 may be a laminate film formed of an AlSi electrode layer, a Ti electrode layer, a Ni electrode layer, and a Au electrode layer laminated in the order of the above description. The AlSi electrode layer, the Ti electrode layer, the Ni electrode layer, and the Au electrode layer may be 0.5 µm, 0.2 µm, 0.7 µm, and 0.1 µm in thickness, respectively. By disposing the Au electrode layer as the outermost layer of back surface electrode 4, the Ni electrode layer is prevented from being oxidized and the wettability of the back surface electrode 4 surface to the solder is excellent. Therefore, voids are prevented from occurring in the boundary between the semiconductor chip and the solder layer (cf. FIG. 1), when the semiconductor chip is mounted. As a result, the semiconductor chip bonds excellently with a solder.

Then, the back surface of semiconductor wafer 20 is treated with a plasma to remove the deposits sticking to the back surface of semiconductor wafer 20 (step S7: the step of plasma treatment). Simultaneously, the front surface of semiconductor wafer 20 may be treated with the plasma to remove the deposits sticking to the front surface of semiconductor wafer 20. The step of plasma treatment will be described later in detail.

Figure 9:
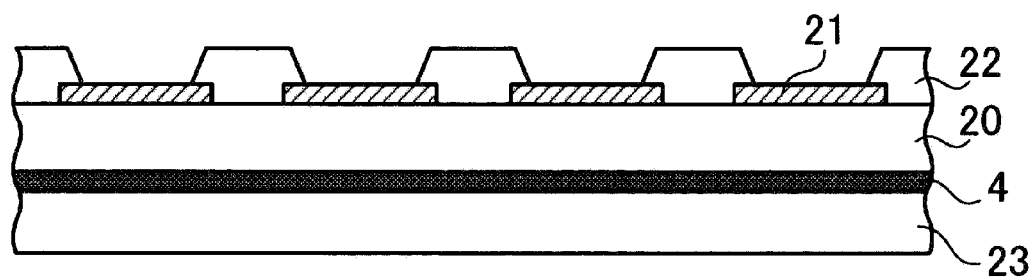
FIG. 9 is a fifth cross sectional view describing the method of manufacturing the semiconductor chip according to the first embodiment of the invention.

Next, a film or a tape, the adhesive strength of which is lowered by heat or by an ultraviolet ray, (hereinafter referred to as "removable adhesive tape 23") is stuck to the back surface of semiconductor wafer 20 (step S8, FIG. 9: the step of sticking). The step of sticking will be described later in detail.

Figure 10:
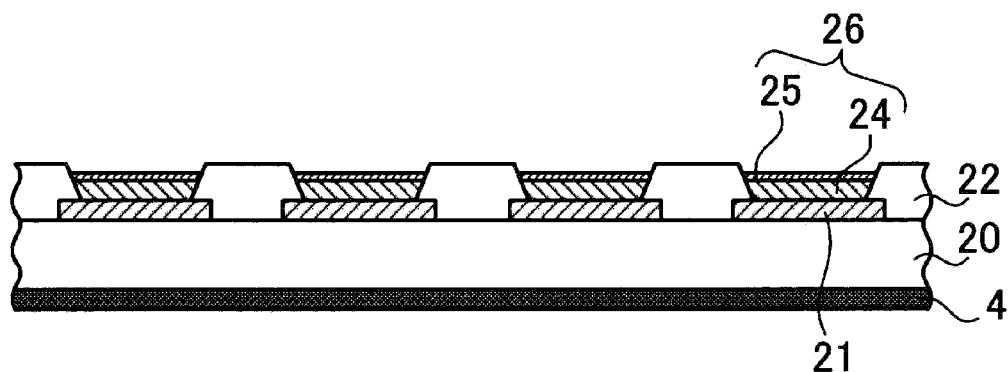
FIG. 10 is a sixth cross sectional view describing the method of manufacturing the semiconductor chip according to the first embodiment of the invention.

Plate film 26 is formed by electroless plating as a front surface electrode on the front surface of semiconductor wafer 20 (step S9, FIG. 10: the step of plating). Plate film 26 may be a laminate film (electroless Ni/Au plate film) formed by laminating first plate layer 24 made from Ni and second plate layer 25 made from Au in the order of the above description. The step of plating will be described later in detail.

The adhesive strength of removable adhesive tape 23 is lowered by irradiating an X-ray on removable adhesive tape 23. Removable adhesive tape 23 is peeled from semiconductor wafer 20 (not shown: the step of peeling). Then, semiconductor wafer 20 is diced into chips to cut out semiconductor chips 1 (not shown: the step of cutting).

Metal plates 5, 6, and 8 connected electrically to first front surface electrode 2 (plate film 26) and back surface electrode 4 are bonded with a solder to the front and back surfaces of semiconductor chip 1 as shown in FIG. 1 (the step of bonding). Metal plate 7 is connected to second front surface electrode 3 via bonding wire 13.

Finally, entire semiconductor chip 1 is sealed, for example, with resin 9 (the step of sealing). Various sealants may be used depending on the semiconductor device formed in semiconductor chip 1. For example, ceramics or low-melting-point-glass may be used for sealing. By the sealing, the semiconductor apparatus as shown in FIG. 1 is completed.

FIGS. 11 through 14 are cross sectional views describing the method of manufacturing the semiconductor chip according to the first embodiment of the invention. In FIGS. 11 through 14, the front surface structure is not shown. In FIGS. 11 through 14, neither the emitter electrode nor the back surface electrode on the semiconductor wafer is shown. In FIGS. 11 through 14, the steps subsequent to step S6 in FIG. 4 are described in detail.

Figure 11:
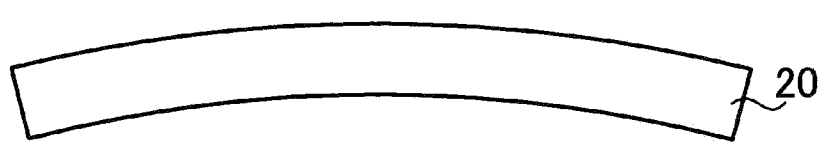
FIG. 11 is a seventh cross sectional view describing the method of manufacturing the semiconductor chip according to the first embodiment of the invention.

After the step of forming the back surface electrode (cf. step S6 in FIG. 4), semiconductor wafer 20 is in the bending state, in which semiconductor wafer 20 is bending convexly toward the front surface side, due to the tensile stress caused by the back surface electrode (not shown) as shown in FIG. 11.

Figure 12:
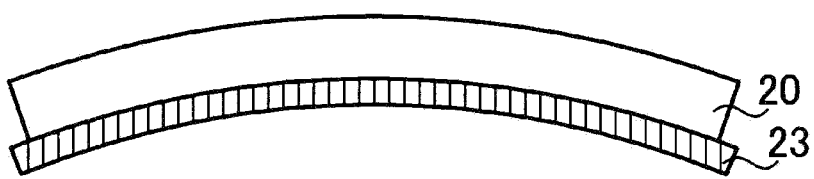
FIG. 12 is an eighth cross sectional view describing the method of manufacturing the semiconductor chip according to the first embodiment of the invention.

After conducting the step of plasma treatment (cf. step S7 in FIG. 4), the step of sticking is conducted as described in FIG. 12 to stick removable adhesive tape 23 to the back surface of semiconductor wafer 20 such that the bending state of semiconductor wafer 20, in which semiconductor wafer 20 is bending convexly toward the front surface side, is maintained (cf. step S8 in FIG. 4).

In the step of sticking, the front surface of semiconductor wafer 20 is absorbed to a stage (not shown) and removable adhesive tape 23 is stuck to the back surface of semiconductor wafer 20 in the state, in which semiconductor wafer 20 is made to be flat. Since the rigidity of removable adhesive tape 23 is lower than the rigidity of semiconductor wafer 20, semiconductor wafer 20 keeps the bending state, in which semiconductor wafer 20 is bending convexly toward the front surface side, after semiconductor wafer 20 is released from the absorption to the stage.

Figure 13:
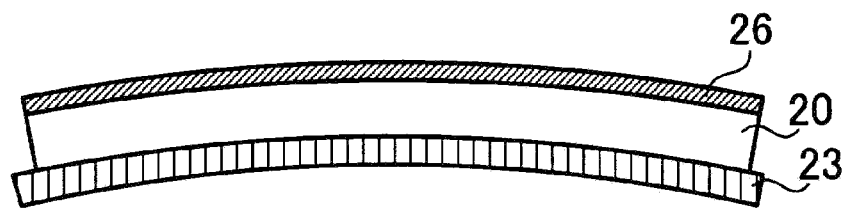
FIG. 13 is a ninth cross sectional view describing the method of manufacturing the semiconductor chip according to the first embodiment of the invention.

The step of plating is conducted as shown in FIG. 13 to form plate film 26 on the front surface of semiconductor wafer 20 bending convexly toward the front surface side (cf. step S9 in FIG. 4). Plate film 26 is formed by electroless plating on semiconductor wafer 20 bending convexly toward the front surface side.

Figure 14:
FIG. 14 is a tenth cross sectional view describing the method of manufacturing the semiconductor chip according to the first embodiment of the invention.

The step of peeling is conducted as shown in FIG. 14 to peel removable adhesive tape 23 off semiconductor wafer 20. By the step of peeling, semiconductor wafer 20 is released from the stress caused by removable adhesive tape 23. As semiconductor wafer 20 is released from the stress caused by removable adhesive tape 23, plate film 26 exerts a tensile stress to the front surface side of semiconductor wafer 20 that deforms semiconductor wafer 20 to be concave toward the front surface side.

On the back surface side of semiconductor wafer 20, the back surface electrode (not shown) exerts a tensile stress that deforms semiconductor wafer 20 to be convex toward the front surface side. In other words, the tensile stresses exerted to the front and back surface sides balance to each other in semiconductor wafer 20 as soon as the step of plating is over (cf. FIG. 13). Due to the tensile stress balance, semiconductor wafer 20 is brought into almost the flat state, when removable adhesive tape 23 is peeled off.

Now the step of plasma treatment will be described below in detail. It has been revealed by the present inventors that if organic deposits are sticking to the back electrode surface, the adhesiveness of removable adhesive tape 23 will be lowered, the plating solutions will come in between the back surface electrode and removable adhesive tape 23, and the back surface electrode will be liable to external appearance anomalies. It is estimated that the deposition of the foreign materials onto the back surface of semiconductor wafer 20 is caused, for example, by the natural absorption of the hydrocarbons (CxHy) in the air onto the electrode surface, by the contact of a tongs or a robot hand of an automatic carrier mechanism to the wafer back surface in handling semiconductor wafer 20, by the placement of a wafer onto a stage of the automatic carrier mechanism, and in such general manufacturing steps. The deposition of the foreign materials onto the back surface of semiconductor wafer 20 may be caused by the deposition from a wafer cassette used commonly with the other step. Further, the wafer may be contaminated also by the oil diffused back from an oil-sealed rotary pump to a vacuum chamber in the sputtering apparatus or the vacuum deposition apparatus for forming the back surface electrode.

Therefore, the step of plasma treatment is conducted to remove the organic materials and such deposits sticking to the back surface of semiconductor wafer 20. By the plasma treatment, the adhesiveness between the back surface of semiconductor wafer 20 and removable adhesive tape 23 is improved in the subsequent step of sticking. Due to the improved adhesiveness between the back surface of semiconductor wafer 20 and removable adhesive tape 23, the plating solution is prevented from coming in between the back surface of semiconductor wafer 20 and removable adhesive tape 23 on the back surface of semiconductor wafer 20 in forming plate film 26 on the front surface of semiconductor wafer 20. Due to this, the problems as described below will be solved.

Figure 15:
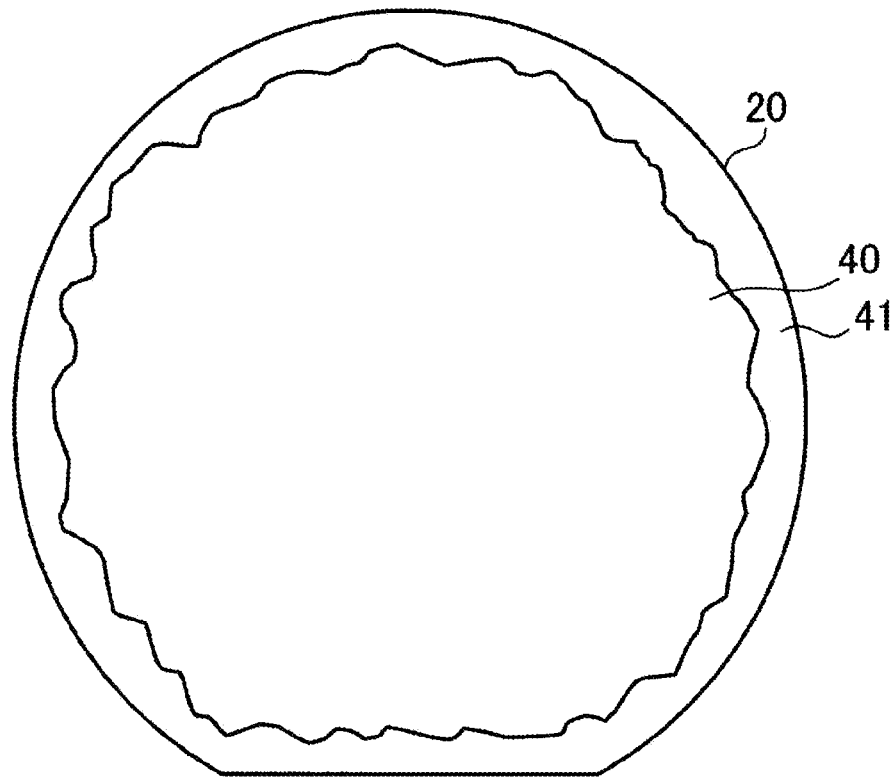
FIG. 15 is a top plan view of a semiconductor wafer showing external appearance anomalies caused on the back surface electrode.

FIG. 15 is a top plan view of the semiconductor wafer showing external appearance anomalies caused on the back surface electrode. When the adhesiveness between semiconductor wafer 20 and removable adhesive tape 23 is not so good, the plating solution will come in between semiconductor wafer 20 and removable adhesive tape 23 from the edge area of semiconductor wafer 20. As shown in FIG. 15, external appearance anomalies 41 such as anomalous segregation of the deposits on the edge area surface of back surface electrode 40 and discoloration of the edge area surface of back surface electrode 40 are caused. These problems are prevented from occurring by treating the back surface of semiconductor wafer 20 with a plasma.

In the step of plasma treatment, the front and back surfaces of semiconductor wafer 20 are treated with a plasma simultaneously to remove, for example, the residues of the polyimide protector film on the front surface of semiconductor wafer 20. By treating the front and back surfaces of semiconductor wafer 20 with a plasma simultaneously, the deposits on the front surface of semiconductor wafer 20 and the deposits on the back surface of semiconductor wafer 20 are removed simultaneously with no problem.

Immediately before applying the plating treatment to the front surface of semiconductor wafer 20, the deposits on the front surface of semiconductor wafer 20 are removed with no problem. By the plasma treatment described above, the problems caused in the front surface electrode as described below are obviated, the adhesiveness between semiconductor wafer 20 and removable adhesive tape 23 is improved, and external appearance anomalies 41 are prevented from occurring on back surface electrode 40 in the step of plating. If compared with the separate plasma treatments applied to the front and back surfaces of semiconductor wafer 20 separately, the number of the steps of plasma treatment is reduced.

When protector film 22 is formed on the front surface of semiconductor wafer 20 (step S3 in FIG. 4), polyimide residues happen to remain on emitter electrode 21 exposed to the opening of protector film 22. If polyimide residues are on the emitter electrode 21 surface, it is impossible to grow a normal Ni plate layer (first plate layer 24) on emitter electrode 21. Since the polyimide residues exhibit high resistance against chemical reagents, the polyimide residues cannot be removed by the step of degreasing the emitter electrode 21 surface conducted prior to the step of plating nor by the step of removing the passivation film on the emitter electrode 21 surface with a strong basic etching solution. Therefore, it is desirable to remove the polyimide residues by treating the front surface of semiconductor wafer 20 with a plasma.

Now the step of sticking will be described below in detail. In the step of sticking, removable adhesive tape 23 is stuck to the back surface of semiconductor wafer 20 such that at least back surface electrode 4 is covered. Preferably, removable adhesive tape 23 is stuck to the back surface of semiconductor wafer 20 such that the entire back surface of semiconductor wafer 20 is covered. By this treatment, back surface electrode 4 is protected from the plating solution in the step of plating. Since semiconductor wafer 20 is reinforced by removable adhesive tape 23, the strength of semiconductor wafer 20 is improved.

It is desirable to stick removable adhesive tape 23 to the back surface of semiconductor wafer 20 such that removable adhesive tape 23 is extending outward from the back surface edge of semiconductor wafer 20. By making removable adhesive tape 23 extend outward from the back surface edge of semiconductor wafer 20, semiconductor wafer 20 is prevented from being broken, while semiconductor wafer 20 is being housed in a cassette or when semiconductor wafer 20 happens to come in contact with a jig.

However, if the width, for which removable adhesive tape 23 extends outward from the back surface edge of semiconductor wafer 20, (hereinafter referred to as the "extending width of removable adhesive tape 23") is too wide, it will be difficult to house semiconductor wafer 20 in a wafer cassette. Therefore, it is preferable for the extending width of removable adhesive tape 23 to be 1 mm or less.

It is also effective to stick removable adhesive tape 23 to the back surface of semiconductor wafer 20 in the state in which the edge of removable adhesive tape 23 is pulled outside such that a tensile stress is exerted to removable adhesive tape 23. The tensile tress is exerted by pulling out removable adhesive tape 23 in the length direction from the role thereof or the tensile tress is exerted uniformly by pulling the four corners of a cut-out rectangular shoot of removable adhesive tape 23. By exerting a tensile stress to removable adhesive tape 23, a stress is exerted to the back surface side of semiconductor wafer 20 in the contraction direction of removable adhesive tape 23. As a stress is exerted to the back surface side of semiconductor wafer 20 in the contraction direction of removable adhesive tape 23, semiconductor wafer 20, on the back surface of which removable adhesive tape 23 is adhering, maintains the bending state thereof, in which semiconductor wafer 20 is bending convexly toward the front surface side.

In the step of sticking, it is also effective to heat semiconductor wafer 20 at 40° C. or higher and 60° C. or lower in sticking removable adhesive tape 23 to semiconductor wafer 20. Due to the heating, removable adhesive tape 23 is adhering to the back surface of semiconductor wafer 20 in the state in which removable adhesive tape 23 is heated at 40° C. or higher and 60° C. or lower. By sticking removable adhesive tape 23 heated to the back surface of semiconductor wafer 20, a stress is exerted to the back surface side of semiconductor wafer 20 in the thermal contraction direction of removable adhesive tape 23. By exerting a stress to the back surface side of semiconductor wafer 20 in the thermal contraction direction of removable adhesive tape 23, semiconductor wafer 20, on the back surface of which removable adhesive tape 23 is adhering, maintains the bending state thereof, in which semiconductor wafer 20 is bending convexly toward the front surface side.

In the step of sticking, it is effective to stick removable adhesive tape 23 to semiconductor wafer 20 in a vacuum chamber as described in Japanese Patent Publication No. 3607143. By sticking removable adhesive tape 23 to semiconductor wafer 20 in a vacuum chamber, removable adhesive tape 23 is stuck to the back surface of semiconductor wafer 20 without causing any void. Since no voids occur in the boundary between semiconductor wafer 20 and removable adhesive tape 23, the plating solution is prevented from coming in the boundary between semiconductor wafer 20 and removable adhesive tape 23.

It is preferable for the rigidity of removable adhesive tape 23 to be lower than the rigidity of semiconductor wafer 20. Preferably, removable adhesive tape 23 is 5 µm or more and 500 µm or less in thickness. More preferably, removable adhesive tape 23 is 40 µm or more and 80 µm or less in thickness. If removable adhesive tape 23 is 40 µm or more and 80 µm or less in thickness, it will be easier to maintain semiconductor wafer 20 in the state thereof, in which semiconductor wafer 20 is bending convexly toward the front surface side.

It is preferable for removable adhesive tape 23 to be resistant against the electroless plating solution. It is effective for removable adhesive tape 23 to contain any of polyimide (PI), polyphenylene sulfide (PPS), polyethylene terephthalate (PET), and aromatic polyamide (aramid: PA) as a main component.

It is effective for removable adhesive tape 23 to include an adhesive layer on the surface that comes in contact with the back surface of semiconductor wafer 20. It is effective for the adhesive layer to be hardened by heat or an ultraviolet ray and to lower the adhesive strength thereof. It is effective for the adhesive layer to contain a polymer, the main raw material of which is acrylate ($CH_2$=HCOOR), as a main component. It is effective for the adhesive layer to generate vapor therefrom by heat or an ultraviolet ray and to lower the adhesive strength thereof.

Now the step of plating will be described below in detail. In the step of plating, semiconductor wafer 20 is dipped in an electroless plating bath with removable adhesive tape 23 adhering to the back surface thereof. As described earlier, plate film 26 is formed by laminating first plate layer 24 made from Ni and second plate layer 25 made from Au on semiconductor wafer 20 in the order of the above description (cf. FIG. 10). It is effective for first plate layer 24 and second plate layer 25 to be 5 µm and 0.03 µm in thickness, respectively.

It is preferable for first plate layer 24 to be formed by plating in an electroless plating bath kept at 75° C. or higher and 85° C. or lower. It is preferable for second plate layer 25 to be formed by plating in an electroless plating bath kept at 70° C. or higher and 80° C. or lower. By forming first plate layer 24 and second plate layer 25 in the respective temperature ranges described above, the segregation speeds of the plate layers are increased. The electroless plating solutions are prevented from decomposing naturally.

It is effective for first plate layer 24 to be an alloy layer made from Ni and P (electroless Ni—P plate layer). It is preferable for the P concentration in first plate layer 24 to be 2 wt % or more and 8 wt % or less. First plate layer 24, in which the P concentration is in the range described above, exerts a tensile stress to semiconductor wafer 20 at the general room temperature. In other words, first plate layer 24 exerts a tensile stress that deforms semiconductor wafer 20 to be concave toward the front surface side. That is, first plate layer 24 exerts a tensile stress that brings semiconductor wafer 20 bending convexly toward the front surface side into a flat state. Therefore, the warp of semiconductor wafer 20 is reduced, after removable adhesive tape 23 is peeled off semiconductor wafer 20 (cf. Denki Mekki Kenkyuukai (The Society for the Study of Electrolytic Plating), "Mudenkai Mekki Kiso to Ohyo (Electroless Plating Fundamentals and Applications)" (in Japanese), published in May, 1994 by Business & Technology Daily News (Nikkan Kogyo Shimbun Ltd.), p 36).

By thickening or thinning first plate layer 24 appropriately, the warp length of semiconductor wafer 20 is controlled indirectly. It is effective to set the thickness of plate film 26 including first plate layer 24 to be 3 µm or more and 6 µm or less. Especially, plate film 26 including electroless Ni—P first plate layer 24, that is an electroless Ni—P/Au plate film, is the most effective to flatten semiconductor wafer 20 bending convexly toward the front surface side.

As described above, entire back surface electrode 4 is covered with removable adhesive tape 23 in the step of sticking according to the first embodiment of the invention. The adhesive strength between back surface electrode 4 and removable adhesive tape 23 is improved by conducting the step of plasma treatment before conducting the step of sticking. Therefore, back surface electrode 4 is protected by removable adhesive tape 23 securely. By protecting back surface electrode 4 with removable adhesive tape 23, the plating solution never comes in between back surface electrode 4 and removable adhesive tape 23. Therefore, external appearance anomalies 41 are prevented from occurring on the back surface electrode 4 surface. Since external appearance anomalies 41 are prevented from occurring on the back surface electrode 4 surface, the wettability of back surface electrode 4 to the solder is prevented from being impaired. Since the wettability of back surface electrode 4 to the solder is not impaired, voids are prevented from occurring in the boundary between back surface electrode 4 and solder layer 14 in mounting semiconductor chip 1 manufactured by dicing semiconductor wafer 20 by bonding with a solder. Since semiconductor chip 1 and metal plate 8 are bonded to each other with a solder without causing any void, the reliability of semiconductor apparatus is improved.

As described above, the step of sticking and the step of plating are conducted one after another and semiconductor chip 1 is manufactured by dicing semiconductor wafer 20 almost flat. As a result, the warp of semiconductor chip 1 is reduced. Since the warp of semiconductor chip 1 is reduced, semiconductor chip 1 is absorbed accurately at the right position on a stage for measuring the electric characteristics of semiconductor chip 1. Therefore, the electric characteristics of semiconductor chip 1 are measured securely.

Since the warp of semiconductor chip 1 is reduced, the voids caused by the warp of semiconductor chip 1 are prevented from occurring in solder layers 11, 12, and 14 in mounting semiconductor chip 1. As a result, the mounting position deviation of semiconductor chip 1 from the right position caused by the voids in solder layers 11, 12, and 14 is prevented from occurring and short-circuit faults are prevented from occurring. Therefore, semiconductor apparatuses are manufactured with a high throughput of non-defective products.

Since voids are prevented from occurring in solder layers 11, 12, and 14, the semiconductor apparatus life is prevented from being shortened. Therefore, the reliability of the semiconductor apparatus is improved.

Since the warp of semiconductor chip 1 is reduced, the entire or a part of solder layers 11, 12, and 14 is prevented from becoming thinner than the predetermined thickness in the mount of semiconductor chip 1. As a result, semiconductor chip 1 is prevented from deviating from the right mounting position and short-circuit faults are prevented from occurring. Therefore, semiconductor apparatuses are manufactured with a high throughput of non-defective products.

Since the entire or a part of solder layers 11, 12, and 14 is prevented from becoming thinner than the predetermined thickness, the semiconductor apparatus life is prevented from being shortened. Therefore, the reliability of the semiconductor apparatus is improved.

Second Embodiment

It is also effective to stick removable adhesive tape 23 to the back surface of semiconductor wafer 20 to intentionally make semiconductor wafer 20 bend convexly toward the front surface side.

According to the second embodiment, removable adhesive tape 23 is stuck to make semiconductor wafer 20 bend more convexly toward the front surface side in the step of sticking than the bending state of semiconductor wafer 20 in the step of forming a back surface electrode. For example, it is effective to heat removable adhesive tape 23 or to exert a tensile stress to removable adhesive tape 23 in the same manner as according to the first embodiment.

According to the second embodiment, the step of plating is conducted after making semiconductor wafer 20 bend further convexly toward the front surface side as described above. If the bending state caused only by back surface electrode 4 is maintained in the same manner as according to the first embodiment, the tensile stress caused on the front surface side of semiconductor wafer 20 will be larger than the tensile stress caused on the back surface side of semiconductor wafer 20 sometimes. However, it is possible to make the tensile stresses caused on the front and back surface sides of semiconductor wafer 20 balance each other by the technique according to the second embodiment. Therefore, semiconductor wafer 20 is brought into almost a flat state according to the second embodiment in the same manner as according to the first embodiment. The other steps and the conditions according to the second embodiment are the same with those according to the first embodiment.

If semiconductor wafer 20 is not bending convexly toward the front surface side after the step of forming a back surface electrode, semiconductor wafer 20 may be bent intentionally convexly toward the front surface side in the step of sticking with no problem. In other words, if semiconductor wafer 20 is flat or bending concavely toward the front surface side after the step of forming a back surface electrode, the same effects will be obtained by intentionally making semiconductor wafer 20 bend convexly toward the front surface side through the step of sticking.

As described above, the effects similar to the effects obtained by the technique according to the first embodiment are obtained by the technique according to the second embodiment.

Third Embodiment

Figure 16:
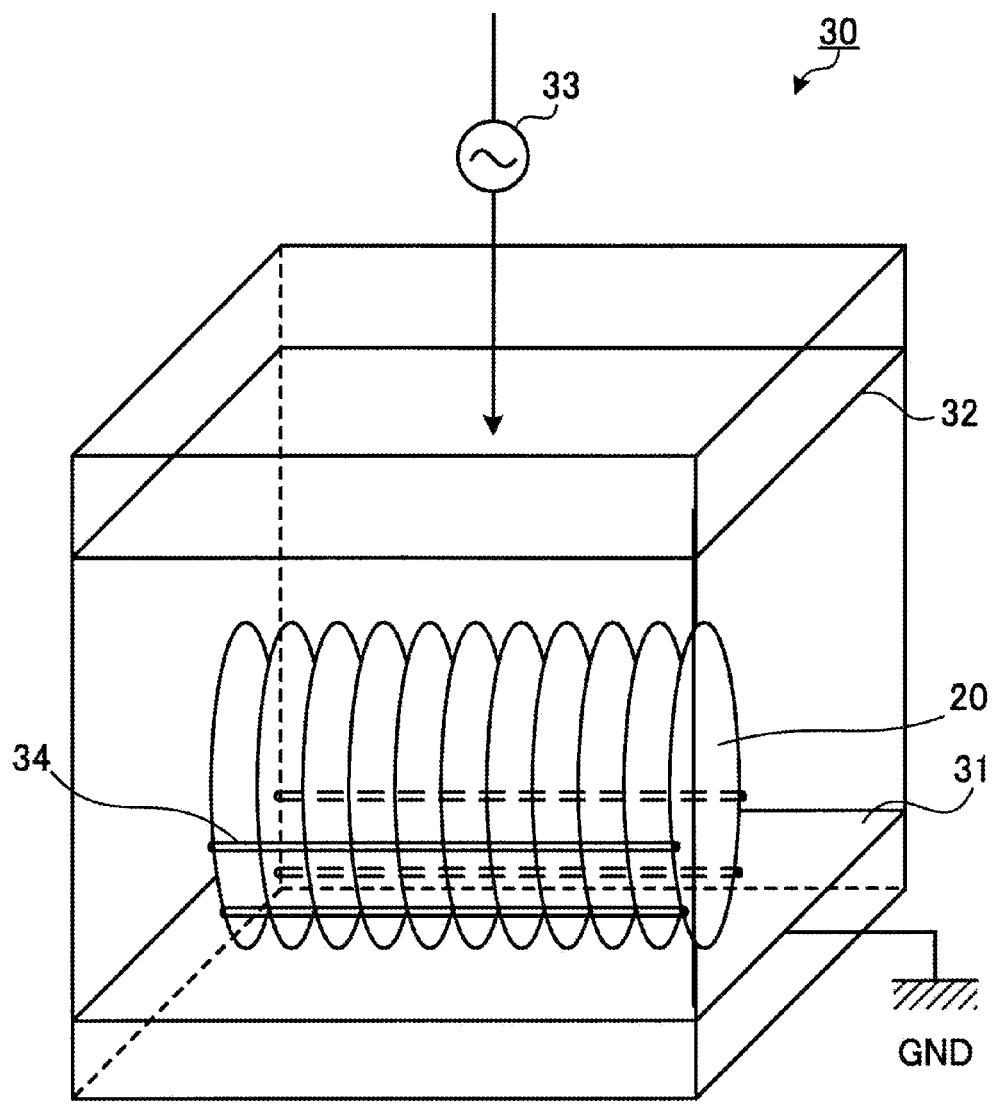
FIG. 16 is a schematic describing a plasma treatment apparatus according to a third embodiment of the invention.

FIG. 16 is a schematic describing a plasma treatment apparatus according to a third embodiment of the invention. As shown in FIG. 16, plasma treatment apparatus 30 includes a capacitively coupled plasma generation mechanism, formed of a pair of flat electrodes 31 and 32, between which semiconductor wafers 20 are placed. Electrode 31 is connected to the ground. Electrode 32 is connected to a high-frequency power source 33. The pair of electrodes 31 and 32 functions as a capacitor. Quartz boat 34 that supports a plurality of semiconductor wafers 20 is between electrodes 31 and 32.

Quartz boat 34 includes four rod-shaped supporting parts that support the semiconductor wafers 20 edges on the electrode 31 side and plate-shaped connecting parts (not shown) connected to the end portions of the supporting parts. The supporting parts are placed in parallel to the surfaces of electrodes 31 and 32. The supporting parts include grooves as wide as to hold the edge portion of semiconductor wafers 20. Semiconductor wafer 20 is supported in perpendicular to quartz boat 34 with the four edge portions thereof on the electrode 31 side put in the grooves of the respective supporting parts. In other words, semiconductor wafers 20 are placed on quartz boat 34 such that the front surfaces thereof are perpendicular to electrode 31.

Quartz boat 34 is shaped such that the portions thereof other than the parts for supporting semiconductor wafers 20 (the supporting parts and the connection parts) are open as the ventilation openings for the raw material gases. Due to the structure described above, raw material gases flow in parallel to the semiconductor wafers 20 surfaces between semiconductor wafers 20. Since the front and back surfaces of semiconductor wafer 20 are exposed to the raw material gas simultaneously, it is possible to treat the front and back surfaces of semiconductor wafer 20 with a plasma simultaneously. Plasma treatment apparatus 30 may be a batch-type one that can simultaneously treat a plurality of semiconductor wafers 20 collectively. Plasma treatment apparatus 30 as described above is used in the steps of plasma treatment described in connection with the first through third embodiments.

In the step of plasma treatment, the plasma that employs oxygen ($O_2$) as the raw material gas may be used. Alternatively, the plasma that employs methane tetrafluoride ($CF_4$) and oxygen ($O_2$) as the raw material gases may be used. The use of those plasmas as described above makes it possible to improve the capability of removing the organic materials sticking to the front and back surfaces of the semiconductor wafer. In the step of plasma treatment, it is effective to set the high-frequency power of high-frequency power source 33 at 900 W (13.56 MHz). It is effective to set the flow rate of oxygen introduced into plasma treatment apparatus 30 at 80 sccm. It is effective to set the pressure inside plasma treatment apparatus 30 at 18 Pa.

By using plasma treatment apparatus 30 as described above, the problems as described below will be obviated. In the pretreatment prior to the step of plating, semiconductor wafer 20 is dipped in a strong acid pretreatment solution of pH 1 or lower and a strong alkaline pretreatment solution of pH 12 or higher. In the step of plating, semiconductor wafer 20 is dipped in relatively hot plating solutions heated, for example, at 70° C. or higher and 85° C. or lower. Removable adhesive tape 23 (cf. FIGS. 9 and 12) functions to protect semiconductor wafer 20 from the pretreatment solutions and the plating solutions.

However, the adhesive strength of removable adhesive tape 23 to the Au electrode layer, the outermost layer of back surface electrode 4, is weaker than adhesive strength thereof to silicon (Si), Al, and a stainless steel (SUS). Therefore, it is difficult to secure the adhesiveness between back surface electrode 4 and removable adhesive tape 23.

If organic deposits are on the surface of the back surface electrode 4, the adhesiveness between back surface electrode 4 and removable adhesive tape 23 will be further lowered. By conducting the step of plasma treatment as described above, it is possible to remove the organic deposits sticking to the surface of the back surface electrode 4. Therefore, the adhesiveness between back surface electrode 4 and removable adhesive tape 23 is improved in the same manner as according to the first embodiment.

If a barrel-type inductively coupled plasma treatment apparatus is employed, similar effects will be obtained. The other steps and conditions are the same with those according to the first embodiment.

As described above, the effects similar to the effects obtained by the technique according to the first embodiment are obtained by the technique according to the third embodiment.

WORKING EXAMPLE 1

Figure 17:
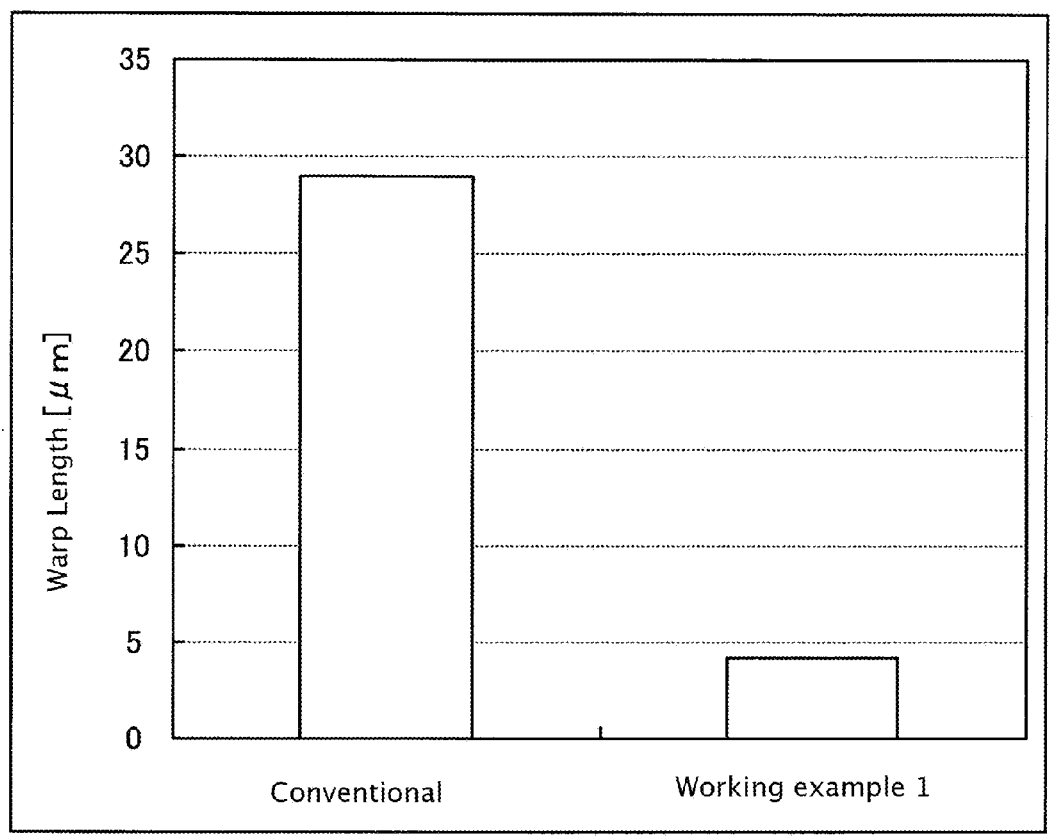
FIG. 17 is a graph describing the warp lengths of semiconductor chips, the size thereof is 12 mm square.

FIG. 17 is a graph describing the warp lengths of semiconductor chips, the size of which is 12 mm square.

First, a semiconductor wafer, the wafer size of which is 6 inches is prepared. The semiconductor wafer includes a back surface electrode formed thereon. The warp of the semiconductor wafer is from 2 to 5 mm.

Then, the step of sticking and the step of plating are conducted according to the first embodiment in the order of the above description (cf. FIGS. 12 and 13). In other words, a removable adhesive tape is stuck to the semiconductor wafer back surface through the step of sticking. Semiconductor chip 1 is manufactured by dicing semiconductor wafer 20 (hereinafter referred to as the "working example 1").

Figure 20:
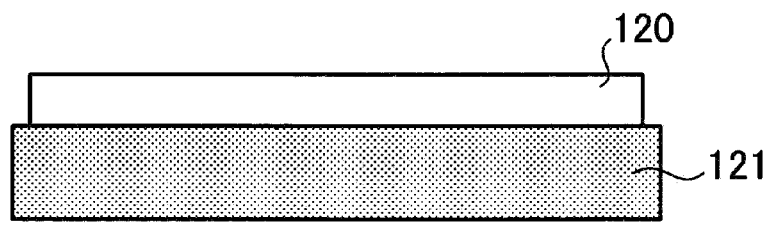
FIG. 20 is a second cross sectional view describing the conventional method of manufacturing the semiconductor chip.
Figure 21:
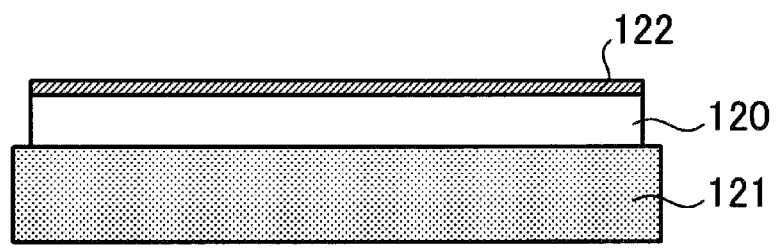
FIG. 21 is a third cross sectional view describing the conventional method of manufacturing the semiconductor chip.
Figure 22:
FIG. 22 is a fourth cross sectional view describing the conventional of manufacturing the semiconductor chip.

For the sake of comparison, a supporting baseboard is stuck to the back surface of a semiconductor wafer and a plating treatment is conducted (cf. FIGS. 20 and 21). A semiconductor chip is manufactured by dicing the semiconductor wafer (hereinafter referred to as the "conventional example"). The other conditions, under which the semiconductor chip of the conventional example is manufactured, are the same with the conditions under which the semiconductor chip of the working example 1 is manufactured.

Figure 23:
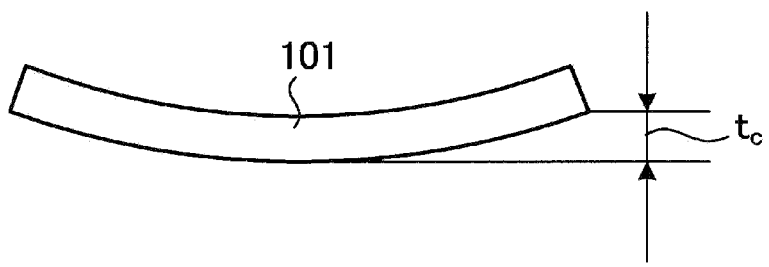
FIG. 23 is a cross sectional view of a semiconductor chip, in which a warp is caused.
Figure 24:
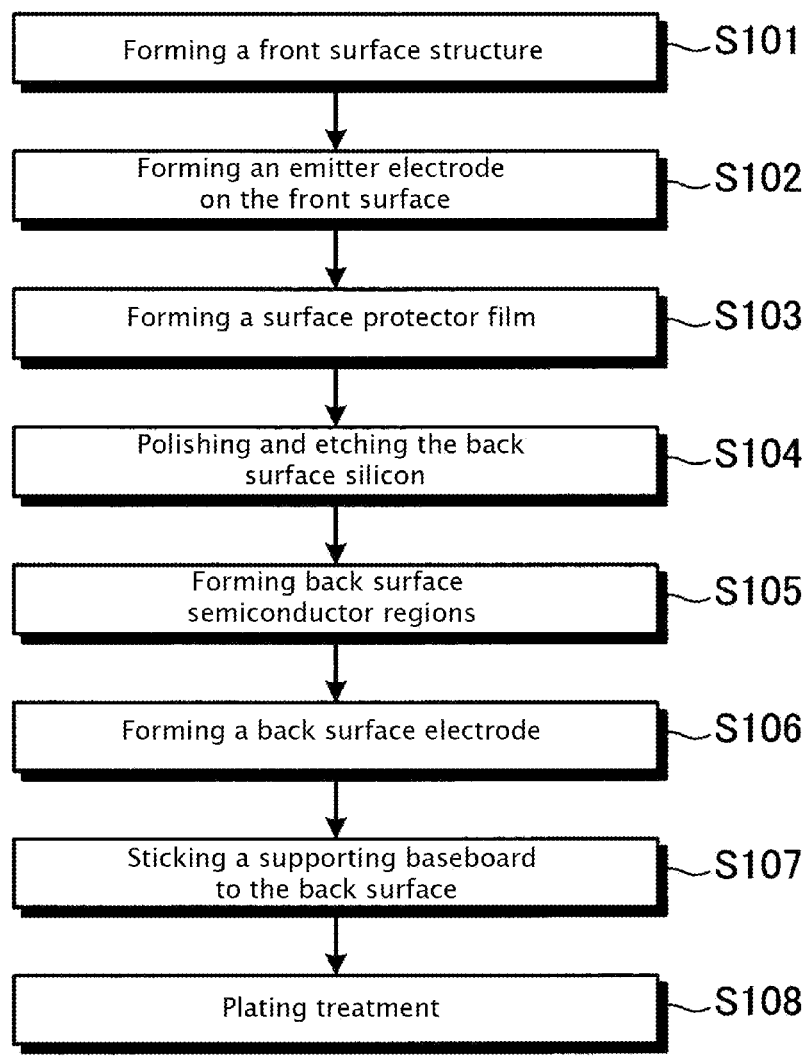
FIG. 24 is a flow chart describing a conventional method of manufacturing a semiconductor chip.

Next, the warps $t_c$ (cf. FIG. 23) of the working example 1 and the conventional example are measured. As described in FIG. 17, the warp length of the semiconductor chip according to the working example 1 is around 4 μm. Although not illustrated, semiconductor wafer 20 according to the working example 1 is almost flat before the dicing. It is estimated that the warp of the working example 1 is reduced, since the warp of semiconductor wafer 20 is obviated by conducting the step of sticking and the step of plating according to the first embodiment. Therefore, it is found that the warp of semiconductor chip is reduced by employing the manufacturing method according to the first embodiment of the invention.

On the other hand, the warp length of the semiconductor chip according to the conventional example is around 29 μm. Therefore, it is obvious that the warp length of the semiconductor chip manufactured by the conventional manufacturing method is larger than the warp length of the semiconductor wafer.

By the investigations conducted by the present inventors, it has been found that the problems caused in evaluating (measuring) the electric characteristics of the semiconductor chips such as in the shipping inspections or in screening the defective chips are prevented from occurring by suppressing the warp length of the semiconductor chip to be from 5 to 10 μm in the after steps as described above. Therefore, by employing the manufacturing method according to the invention, the problems caused in evaluating the electric characteristics of the semiconductor chips are obviated.

It has been revealed also that the problems caused in mounting the semiconductor chip are obviated by suppressing the warp length of the semiconductor chip to be from 5 to 10 μm also in the step of mounting the semiconductor chip. Therefore, by employing the manufacturing method according to the invention, the problems caused in mounting the semiconductor chip are obviated.

Working Example 2

Figure 18:
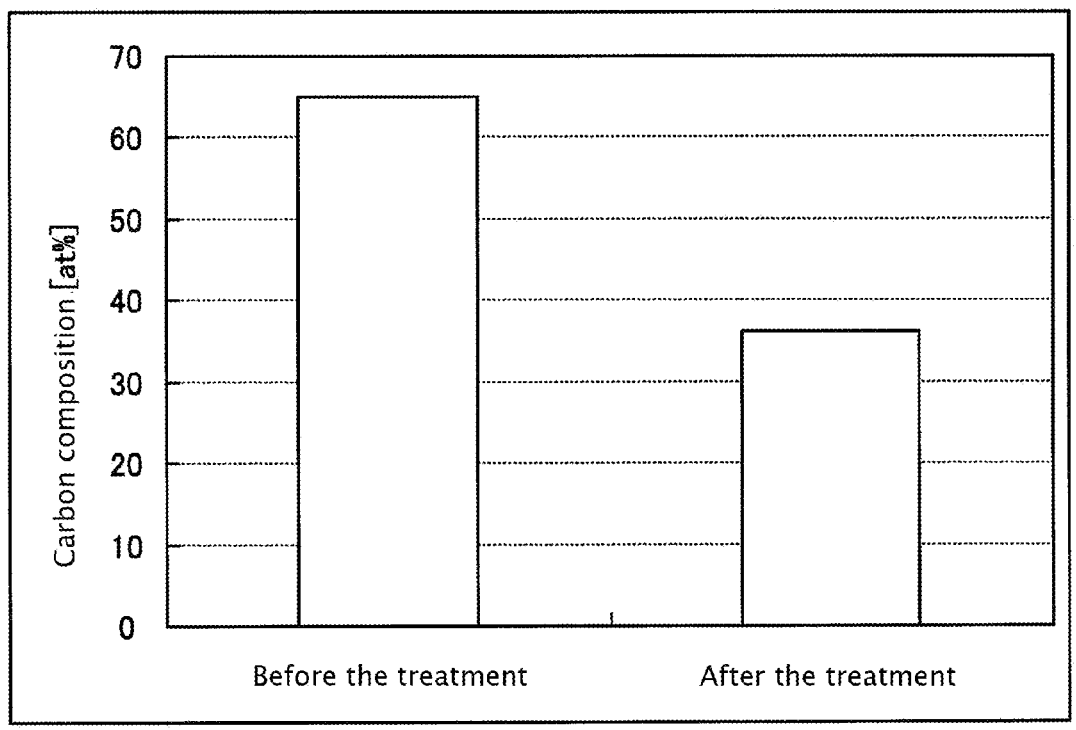
FIG. 18 is a graph describing the carbon amounts on the back surface electrode.
Figure 19:
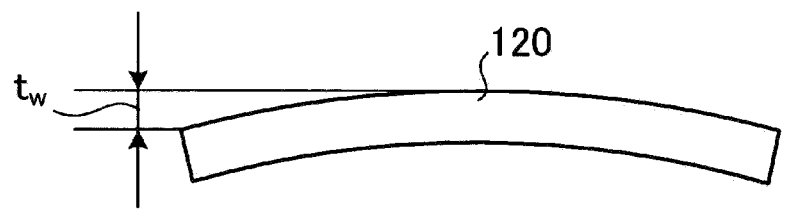
FIG. 19 is a first cross sectional view describing a conventional method of manufacturing a semiconductor chip.

FIG. 18 is a graph describing the carbon amount on the back surface electrode. In FIG. 18, the carbon composition on the back surface electrode is measured by electron spectroscopy for chemical analysis (hereinafter referred to as "ESCA"). First, a semiconductor wafer, on which a back surface electrode is formed, (hereinafter referred to as a "semiconductor wafer of the working example 2") is prepared according to the first embodiment. On the semiconductor wafer of the working example 2, the carbon amounts before and the after the step of plasma treatment are measured.

As described in FIG. 18, the carbon amount before the step of plasma treatment is 65 at %. The carbon amount after the step of plasma treatment is 36 at %. Thus, it has been revealed that the deposits sticking to the back surface electrode are reduced by conducting the step of plasma treatment. Here, "at %" means "atomic percent" that indicates the number of the carbon atoms contained in 100 atoms.

Although the invention has been described in connection with an IGBT, the invention is applicable to the semiconductor devices that include a front surface electrode and a back surface electrode such as a metal oxide semiconductor field effect transistor (MOSFET) and a free wheeling diode (FWD).

The step of plasma treatment may be applied not only to the semiconductor wafer, in which the warp described above is caused, but also to the semiconductor wafer including the surface, to which the step of plating is to be applied, and the surface, to which a tape is to be stuck. In this case, the surface, to which the step of plating is to be applied, and the surface, to which a tape is to be stuck, are treated with a plasma before conducting the step of plating and the step of sticking in the same manner as according to the embodiments described above. The surface to which the step of plating is to be applied, and the surface to which a tape is to be stuck, may be treated with a plasma simultaneously.

Industrial Applicability

As described above, the manufacturing method according to the invention is useful to manufacture a semiconductor chip, the device thickness therein is thin. Especially, the manufacturing method according to the invention is suitable to manufacture semiconductor apparatuses such as IGBT's used in general purpose inverters, AC servos, uninterruptible power sources (UPS's), switching power supplies, and boost DC-DC converters for hybrid vehicles.

Thus, a method of manufacturing a semiconductor apparatus has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

This application is based on and claims priority to Japanese Patent Application 2010-093260, filed on Apr. 14, 2010. The disclosure of the priority application in its entirety, including the drawings, claims, and the specification thereof, is incorporated herein by reference.

What is claimed is:

1. A method of manufacturing a semiconductor apparatus, the method comprising:
    forming a back surface electrode on a back surface of a semiconductor wafer, causing the semiconductor wafer to bend;
    adhering a first film to the back surface of the semiconductor wafer which is in a bent state as a result of the back surface electrode being formed thereon, in order to maintain the bent state of the semiconductor wafer; and
    plating a second film on a front surface of the semiconductor wafer while it is in the bent state, wherein the second film is a front surface electrode, the step of plating being conducted after the step of adhering the first film.

2. The method according to claim 1, the method further comprising:
    cutting the semiconductor wafer into a plurality of semiconductor chips, the cutting being conducted after the plating.

3. The method according to claim 2, the method further comprising: peeling the first film off the semiconductor wafer, the peeling being conducted after the plating and before the cutting.

4. The method according to claim 2, the method further comprising: bonding a metal body to each of a front surface side and a back surface side of the semiconductor chip cut out through the step of cutting, the metal bodies functioning as radiators and being connected electrically to the front surface electrode and the back surface electrode, respectively; and sealing at least the semiconductor chip entirely.

5. The method according to claim 1, wherein the front surface of the semiconductor wafer is absorbed during adhering such that it flattens the semiconductor wafer, and the first film is stuck to the back surface of the flattened semiconductor wafer.

6. The method according to claim 1, wherein the first film is adhering such that it covers at least the back surface electrode on the semiconductor wafer.

7. The method according to claim 1, wherein the first film is adhering such that it covers the back surface of the semiconductor wafer entirely.

8. The method according to claim 1, wherein the first film is adhering such that the first film extends outwardly from a back surface edge of the semiconductor wafer.

9. The method according to claim 8, wherein the first film extends outwardly from the back surface edge of the semiconductor wafer for 1 mm or less.

10. The method according to claim 1, wherein the first film is stuck in the adhering such that it is pulled outwardly such that a tensile force is exerted on it.

11. The method according to claim 1, wherein the first film is heated at 40° C. or higher and 60° C. or lower during adhering.

12. The method according to claim 1, wherein a rigidity of the film or the tape is lower than a rigidity of the semiconductor wafer.

13. The method according to claim 1, wherein the first film is 40 μm or more and 80 μm or less in thickness.

14. The method according to claim 1, wherein the first film contains one of the polymers selected from the group consisting of (polyimide, polyphenylene sulfide, polyethylene terephthalate, and aromatic polyamide) as one of main components.

15. The method according to claim 1, wherein the first film exhibits an adhesive strength which is lowered by heat or an ultraviolet ray.

16. The method according to claim 15, wherein the first film comprises an adhesive layer which contacts the back surface of the semiconductor wafer, and the adhesive layer is hardened by heat or by an ultraviolet ray such that its adhesive strength is lowered.

17. The method according to claim 15, wherein the first film comprises an adhesive layer which contacts the back surface of the semiconductor wafer, and the adhesive layer comprises a polymer made mainly from an acrylate as a main component.

18. The method according to claim 15, wherein the first film comprises an adhesive layer in contact with the back surface of the semiconductor wafer, which decreases in adhesive strength and generates vapor when heated or exposed to ultraviolet light.

19. The method according to claim 1, wherein the back surface electrode comprises a laminate film comprising a gold electrode layer laminated as an outermost layer of the laminate film.

20. The method according to claim 1, wherein the second film is formed by an electroless plating method.

21. The method according to claim 1, wherein the second film comprises a laminate film comprising a first plate layer made from nickel and a second plate layer on the first plate layer, the second plate layer being made from gold.

22. The method according to claim 21, wherein the first plate layer is plated in an electroless plating bath kept at 75° C. or higher and 85° C. or lower.

23. The method according to claim 21, wherein the second plate layer is plated in an electroless plating bath kept at 70° C. or higher and 80° C. or lower.

24. The method according to claim 21, wherein the first plate layer comprises an alloy made from nickel and phosphorus and a phosphorus concentration in the first plate layer is 2 wt % or higher and 8 wt % or lower.

25. The method according to claim 21, wherein the plate film is 3 μm or more and 6 μm or less in thickness.

26. The method according to claim 1, wherein the method further comprises forming an electrode containing aluminum as a main component on the front surface of the semiconductor wafer before forming the back surface electrode on the back surface of the semiconductor wafer, and the second film is formed when plating on the electrode containing aluminum as the main component thereof.

27. The method according to claim 1, wherein the method further comprises thinning the semiconductor wafer from the back surface side before forming the back surface electrode on the back surface of the semiconductor wafer, and the back surface electrode is formed on the back surface of the thinned semiconductor wafer.

28. The method according to claim 27, wherein the semiconductor wafer is thinned in the step of thinning to be 80 μm or more and 140 μm or less in thickness.

29. The method according to claim 1, the method further comprising:
  plasma treating the back surface of the semiconductor wafer with a plasma for removing deposits sticking to the back surface of the semiconductor wafer, the plasma treating being conducted after forming the back surface electrode and before the adhering.

30. The method according to claim 29, wherein the front surface and the back surface of the semiconductor wafer are treated with a plasma simultaneously in the step of plasma treating for removing deposits sticking to the front surface and the back surface of the semiconductor wafer simultaneously.

31. The method according to claim 29, wherein oxygen is used as a raw material in the step of plasma treating.

32. The method according to claim 29, wherein a capacitively coupled plasma generation mechanism is used in the plasma treating.

33. The method according to claim 29, wherein a batch-type plasma treating apparatus that treats a plurality of the semiconductor wafers collectively is used in the plasma treating.

34. The method according to claim 33, wherein a plasma treating apparatus that treats the front surface and the back surface of the semiconductor wafer simultaneously is used in the step of plasma treating.

35. A method of manufacturing a semiconductor apparatus, the method comprising:
  forming a back surface electrode on a back surface of a semiconductor wafer;
  adhering a first film to the back surface of the semiconductor wafer, causing the semiconductor wafer to bend convexly toward a front surface side of the semiconductor wafer, the step of adhering being conducted after the step of forming the back surface electrode; and
  plating a second film on a front surface of the semiconductor wafer while it is in the bent state, wherein the second film is a front surface electrode.

36. A method of manufacturing a semiconductor apparatus, the method comprising
  adhering a first film to a back surface of a semiconductor wafer bent convexly toward a front surface side of the semiconductor wafer due to a back surface electrode being formed on the back surface of the semiconductor wafer to maintain the bent state of the semiconductor wafer, and
  plating a second film on a front surface of the semiconductor wafer while it is in the bent state, the second film being a front surface electrode, the plating being conducted after the adhering.

* * * * *